(12) United States Patent
Mizuguchi

(10) Patent No.: US 9,875,920 B1
(45) Date of Patent: Jan. 23, 2018

(54) SUBSTRATE PROCESSING APPARATUS

(71) Applicant: HITACHI KOKUSAI ELECTRIC INC., Tokyo (JP)

(72) Inventor: Yasuhiro Mizuguchi, Toyama (JP)

(73) Assignee: HITACHI KOKUSAI ELECTRIC, INC., Tokyo (JP)

( * ) Notice: Subject to any disclaimer, the term of this patent is extended or adjusted under 35 U.S.C. 154(b) by 0 days.

(21) Appl. No.: 15/270,419

(22) Filed: Sep. 20, 2016

(30) Foreign Application Priority Data

Jul. 21, 2016 (JP) .................. 2016-143329

(51) Int. Cl.
| | |
|---|---|
| *H01L 21/00* | (2006.01) |
| *H01L 21/67* | (2006.01) |
| *C23C 16/52* | (2006.01) |
| *C23C 16/44* | (2006.01) |
| *C23C 16/455* | (2006.01) |

(52) U.S. Cl.
CPC ...... *H01L 21/6719* (2013.01); *C23C 16/4412* (2013.01); *C23C 16/455* (2013.01); *C23C 16/52* (2013.01); *H01L 21/67017* (2013.01); *H01L 21/67196* (2013.01); *H01L 21/67253* (2013.01); *H01L 21/67271* (2013.01); *H01L 21/67288* (2013.01)

(58) Field of Classification Search
CPC ..................................... C23C 16/52
USPC ........................ 700/121; 118/719
See application file for complete search history.

(56) References Cited

U.S. PATENT DOCUMENTS

| | | | |
|---|---|---|---|
| 6,074,443 A | 6/2000 | Venkatest et al. | |
| 2002/0096114 A1* | 7/2002 | Carducci | C23C 14/56 118/715 |
| 2003/0029383 A1* | 2/2003 | Ward | G05B 19/41865 118/719 |
| 2008/0075834 A1* | 3/2008 | Ramaswamy | C23C 14/48 427/8 |
| 2009/0164040 A1 | 6/2009 | Kawada | |
| 2011/0218659 A1 | 9/2011 | Nomura | |
| 2012/0031330 A1* | 2/2012 | Tsumori | C30B 25/12 118/708 |

FOREIGN PATENT DOCUMENTS

| | | |
|---|---|---|
| JP | 06-267809 A | 9/1994 |
| JP | 10-189687 A | 7/1998 |

(Continued)

*Primary Examiner* — Gordon R Baldwin
*Assistant Examiner* — Charlee Bennett
(74) *Attorney, Agent, or Firm* — Volpe and Koenig, P.C.

(57) ABSTRACT

A substrate processing apparatus includes: a plurality of modules configured to process a substrate; a transfer chamber adjoining the modules; a transfer part configured to transfer the substrate to one of the modules; a reception part configured to receive process information of the substrate; a detection part configured to detect quality information of the respective modules; a table in which the process information corresponds to the quality information; a memory part configured to store the table; and a controller configured to compare the process information received by the reception part with the quality information detected by the detection part using the table, configured to select one of the modules corresponding to the process information, and configured to instruct the transfer part to transfer the substrate to the selected module.

16 Claims, 18 Drawing Sheets

(56) References Cited

FOREIGN PATENT DOCUMENTS

| | | | |
|---|---|---|---|
| JP | 2009-152357 | A | 7/2009 |
| JP | 2009-158736 | A | 7/2009 |
| JP | 2011-114212 | A | 6/2011 |
| JP | 2011-181771 | A | 9/2011 |

* cited by examiner

FIG. 9

Data table

| Quality information | | | | Module | | | | | | | | |
|---|---|---|---|---|---|---|---|---|---|---|---|---|
| | | | | PM1 | | PM2 | | PM3 | | PM4 | | |
| | | | | RC1 | RC2 | RC3 | RC4 | RC5 | RC6 | RC7 | RC8 | |
| Module quality information | RC quality information | | Cumulative processed wafer number | A1 | A2 | A3 | A4 | A5 | A6 | A7 | A8 | |
| | | | Plasma control system | B1 | B2 | B3 | B4 | B5 | B6 | B7 | B8 | |
| | | | Gas supply/exhaust system | C1 | C2 | C3 | C4 | C5 | C6 | C7 | C8 | |
| | | | ... | D1 | D2 | D3 | D4 | D5 | D6 | D7 | D8 | |
| | | Common component quality information | Common gas supply/exhaust system | E1 | | E2 | | E3 | | E4 | | |
| | | | ... | F1 | | F2 | | F3 | | F4 | | |
| Wafer quality information | | | Particle number | G1 | G2 | G3 | G4 | G5 | G6 | G7 | G8 | |
| | | | Wafer in-plane distribution | H1 | H2 | H3 | H4 | H5 | H6 | H7 | H8 | |
| | | | Refractive index | I1 | I2 | I3 | I4 | I5 | I6 | I7 | I8 | |
| | | | Film stress | J1 | J2 | J3 | J4 | J5 | J6 | J7 | J8 | |
| | | | ... | K1 | K2 | K3 | K4 | K5 | K6 | K7 | K8 | |

FIG. 10

Definition table 1

| Quality information | | | | P0 | P1 | P2 | P3 | P4 | P5 | P6 | P7 | P8 | P9 | P10 | P11 | P12 | P13 |
|---|---|---|---|---|---|---|---|---|---|---|---|---|---|---|---|---|---|
| | | | | | | | | | | | Process information | | | | | | |
| Module quality information | RC quality information | | Cumulative processed wafer number | — | ○ | — | — | — | — | — | — | — | — | — | — | — | — |
| | | | Plasma control system | — | — | ○ | ○ | ○ | — | — | — | — | — | — | — | — | — |
| | | | Gas supply/exhaust system | — | — | — | — | — | ○ | — | — | — | — | — | — | — | — |
| | | | ... | — | — | — | — | — | — | — | — | — | — | — | — | — | — |
| | Common component quality information | | Common gas supply/exhaust system | — | — | — | — | — | — | ○ | — | — | — | — | — | — | — |
| | | | ... | — | — | — | — | — | — | — | — | — | — | — | — | — | — |
| Wafer quality information | | | Particle number | — | — | — | — | — | — | — | — | ○ | — | — | — | — | — |
| | | | Wafer in-plane distribution | — | — | — | — | — | — | — | — | — | ○ | — | — | — | — |
| | | | Refractive index | — | — | — | — | — | — | — | — | — | — | ○ | — | — | — |
| | | | Film stress | — | — | — | — | — | — | — | — | — | — | — | ○ | — | — |
| | | | ... | — | — | — | — | — | — | — | — | — | — | — | — | ○ | ○ |

FIG. 11A

Definition table 2

| RC1 | | Process information | | Maintenance process |
|---|---|---|---|---|
| | Cumulative processed wafer number y | Process 1 | Process 2 | |
| L1 | 0 < y ≤ 200 | ○ | ○ | — |
| L2 | 200 < y ≤ 400 | ○ | — | — |
| L3 | 400 < y ≤ 600 | — | — | — |
| L4 | 600 < y | — | — | ○ |

| RC2 | | Process information | | Maintenance process |
|---|---|---|---|---|
| | Cumulative processed wafer number y | Process 1 | Process 2 | |
| L1 | 0 < y ≤ 200 | ○ | ○ | — |
| L2 | 200 < y ≤ 400 | ○ | — | — |
| L3 | 400 < y ≤ 600 | — | — | — |
| L4 | 600 < y | — | — | ○ |

PM1

SUBSTRATE PROCESSING APPARATUS

CROSS-REFERENCE TO RELATED APPLICATION(S)

This application is based upon and claims the benefit of priority from Japanese Patent Application No. 2016-143329, filed on Jul. 21, 2016, the entire contents of which are incorporated herein by reference.

TECHNICAL FIELD

The present disclosure relates to a substrate processing apparatus.

BACKGROUND

As one example of a substrate processing apparatus used in a semiconductor device manufacturing process, there is available an apparatus provided with a module including a reactor.

In a state-of-the-art semiconductor device, many different films are used. The term "film types" used herein refer to films repeatedly used in a semiconductor device, for example, a silicon oxide film and the like. In the semiconductor device, the same film type is repeatedly used. Films have film qualities such as film thickness, film density and the like, which vary depending on the type of film processing process used. When processing individual films in a substrate processing apparatus, it is necessary to meet the requirements of each film type and each film quality.

The term "semiconductor device" used herein refers to, for example, a memory having a two-dimensional structure or a memory having a three-dimensional structure. Furthermore, the term "process" refers to, for example, a process of forming an interlayer insulating film configured to provide insulation between laminated circuit layers and composed of an oxide film, or an oxide film forming process for performing a double patterning process which forms a pattern having a fine pitch.

In a general substrate processing apparatus, in view of the use efficiency of the apparatus, the type of gas supplied to the substrate processing apparatus is fixed and films having the same film type and film quality are processed. Thus, it is necessary for substrates to be processed under the same condition in the respective apparatuses. For that reason, management is performed so as to make the process conditions uniform in the respective modules. Accordingly, it is difficult to perform a plurality of processes differing in film quality with one substrate processing apparatus.

As a solution to this problem, it is conceivable to prepare a substrate processing apparatus for each process. However, there is a limit in a footprint within a factory. It is therefore difficult to prepare a large number of substrate processing apparatuses.

SUMMARY

The present disclosure provides some embodiments of a technique capable of processing substrates without being restricted to the types of processes.

According to one embodiment of the present disclosure, there is provided a technique including: a plurality of modules configured to process a substrate; a transfer chamber adjoining the modules; a transfer part configured to transfer the substrate to one of the modules; a reception part configured to receive process information of the substrate; a detection part configured to detect quality information of the respective modules; a table in which the process information corresponds to the quality information; a memory part configured to store the table; and a controller configured to compare the process information received by the reception part with the quality information detected by the detection part using the table, configured to select one of the modules corresponding to the process information, and configured to instruct the transfer part to transfer the substrate to the selected module.

BRIEF DESCRIPTION OF THE DRAWINGS

FIG. 9 is an explanatory view illustrating one example of a table according to an embodiment of the present disclosure.

FIG. 10 is an explanatory view illustrating one example of a table according to an embodiment of the present disclosure.

FIGS. 11A to 11D are explanatory views illustrating one example of a table according to an embodiment of the present disclosure.

DETAILED DESCRIPTION

Embodiments of the present disclosure will now be described in detail with reference to the drawings.

First Embodiment of the Present Disclosure

First, descriptions will be made on a first embodiment of the present disclosure.

(1) Configuration of Substrate Processing Apparatus

Figure 1:
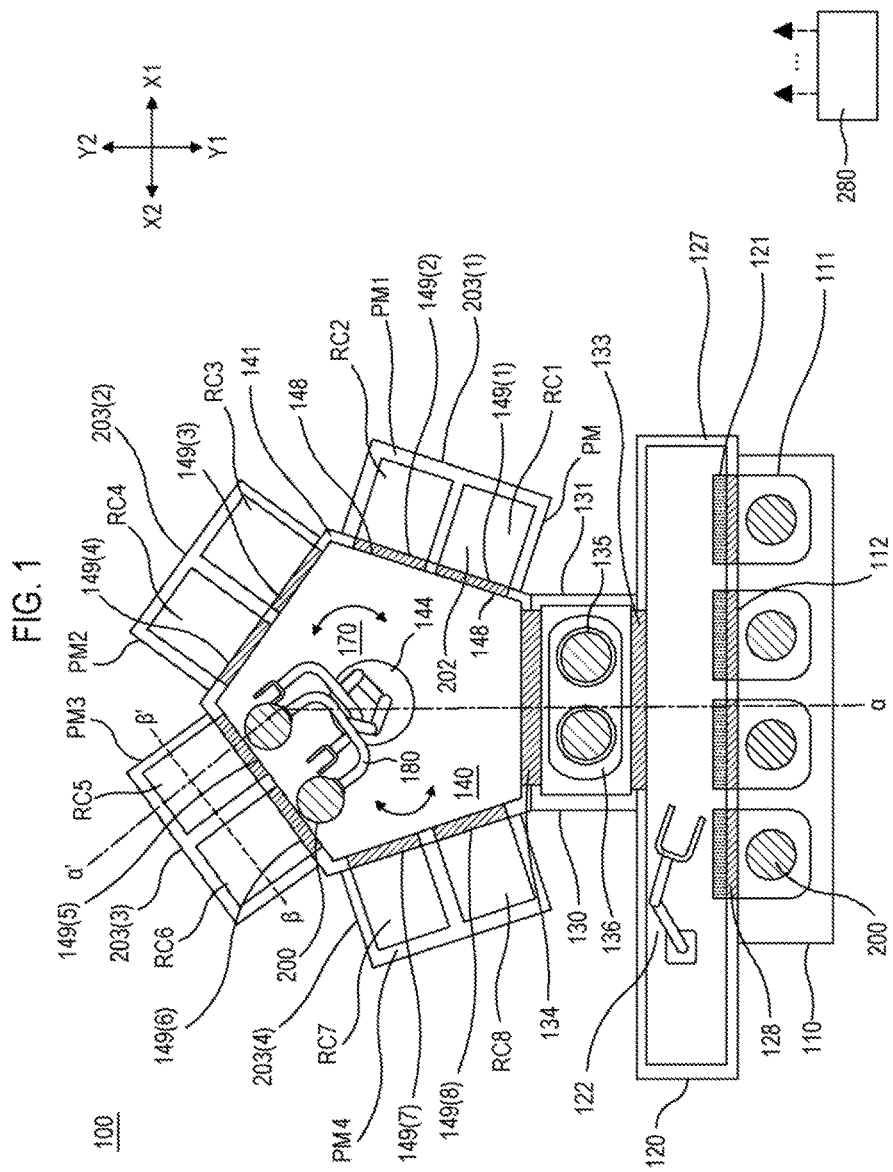
FIG. 1 is an explanatory view illustrating a schematic configuration example of a substrate processing apparatus according to an embodiment of the present disclosure.
Figure 2:
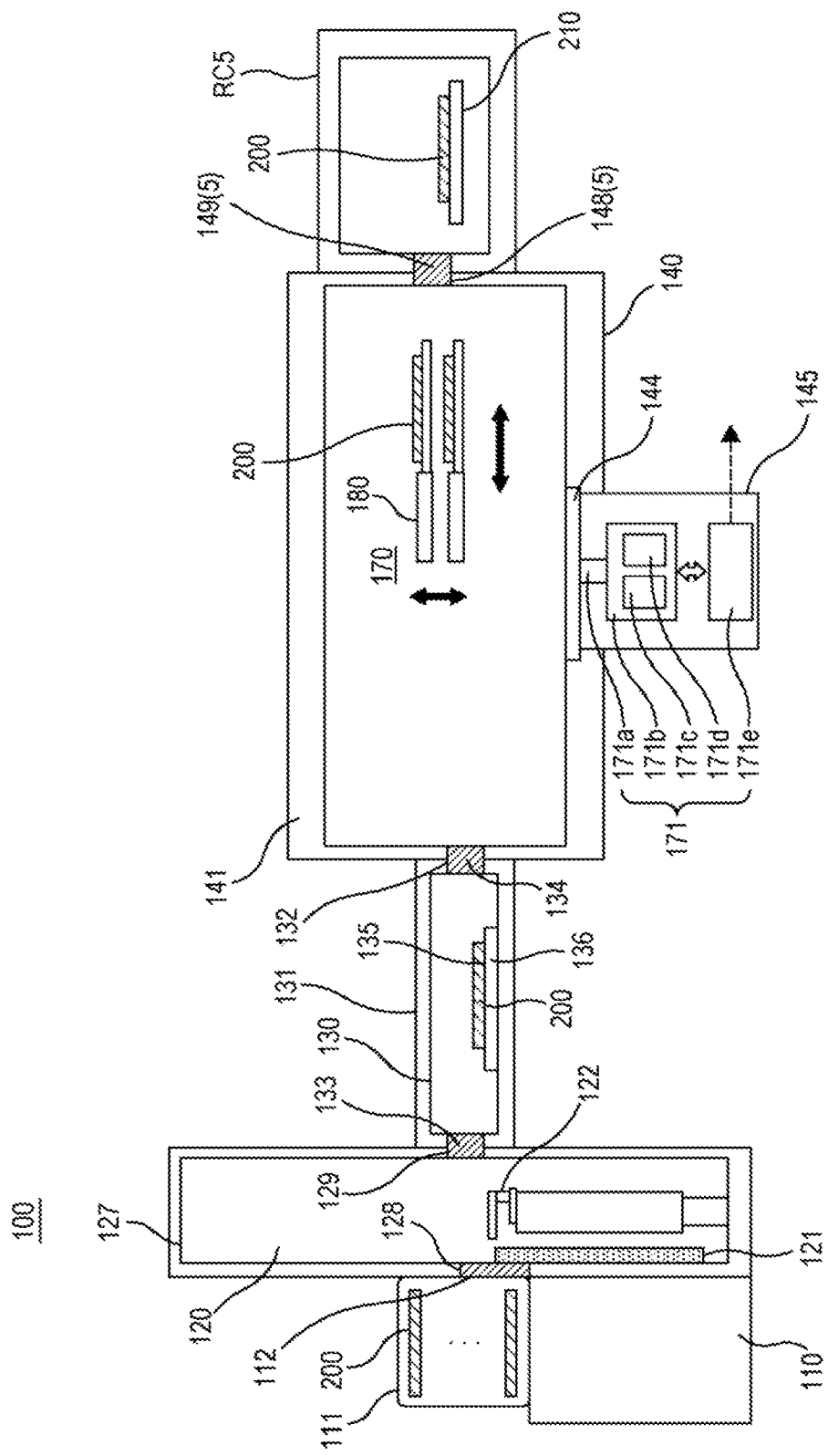
FIG. 2 is an explanatory view illustrating a schematic configuration example of a substrate processing apparatus according to an embodiment of the present disclosure.

A schematic configuration of a substrate processing apparatus according to one embodiment of the present disclosure will be described with reference to FIGS. 1 and 2. FIG. 1 is a horizontal sectional view illustrating a configuration example of the substrate processing apparatus according to the present embodiment. FIG. 2 is a vertical sectional view taken along line α-α' in FIG. 1, illustrating a configuration example of the substrate processing apparatus according to the present embodiment.

Referring to FIGS. 1 and 2, a substrate processing apparatus 100, to which the present disclosure is applied, is configured to process wafers 200 as substrates and is mainly configured by an IO stage 110, an atmosphere transfer chamber 120, a load lock chamber 130, a vacuum transfer chamber 140 and modules PM. Next, the respective components will be described in detail. In describing FIG. 1, the X1 direction is right, the X2 direction is left, the Y1 direction is front, and the Y2 direction is rear.

(Atmosphere Transfer Chamber and IO Stage)

Figure 3:
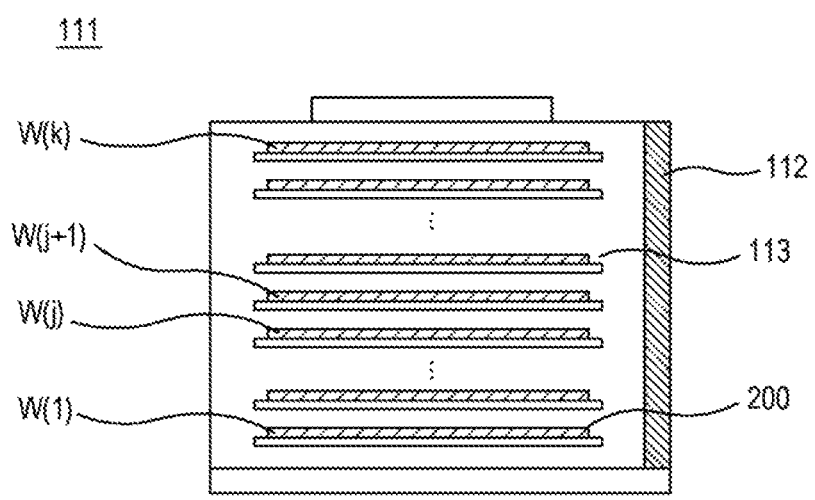
FIG. 3 is an explanatory view illustrating a pod according to an embodiment of the present disclosure.

The IO stage (load port) 110 is installed at the front side of the substrate processing apparatus 100. A plurality of pods 111 is mounted on the IO stage 110. The pods 111 are used as carriers which carry wafers 200 such as silicon (Si) substrates or the like. As illustrated in FIG. 3, a support portion 113 that horizontally supports the wafers 200 in multiple stages is installed in each of the pods 111.

Wafer numbers are given to the wafers 200 stored in each of the pods 111. The wafer numbers are put in parentheses. Referring to FIG. 3, for example, the wafer numbers are set as W(1), . . . , W(j), W(j+1), . . . , and W(k) (where 1<j<k) sequentially from below. As will be described later, these wafer numbers are linked with the below-mentioned process information.

A cap 112 is installed in the pod 111 and is opened or closed by a pod opener 121. The pod opener 121 opens or closes the cap 112 of the pod 111 mounted on the IO stage 110 and opens or closes a substrate loading/unloading opening, thereby making it possible to load or unload the wafers 200 with respect to the pod 111. The pod 111 is supplied to or discharged from the IO stage 110 by an automated material handling system (AMHS) not shown.

The IO stage 110 adjoins the atmosphere transfer chamber 120. The below-mentioned load lock chamber 130 is connected to the opposite surface of the atmosphere transfer chamber 120 from the IO stage 110. An atmosphere transfer robot 122 that transfers the wafers 200 is installed in the atmosphere transfer chamber 120.

Substrate loading/unloading gates 128 for loading or unloading the wafers 200 with respect to the atmosphere transfer chamber 120 and pod openers 121 are installed at the front side of a housing 127 of the atmosphere transfer chamber 120. A substrate loading/unloading gate 129 for loading or unloading the wafers 200 with respect to the load lock chamber 130 is installed at the rear side of the housing 127 of the atmosphere transfer chamber 120. The substrate loading/unloading gate 129 is opened or closed by a gate valve 133, thereby making it possible to load or unload the wafers 200.

(Load Lock Chamber)

The load lock chamber 130 adjoins the atmosphere transfer chamber 120. The below-mentioned vacuum transfer chamber 140 is disposed at the opposite surface of a housing 131 of the load lock chamber 130 from the atmosphere transfer chamber 120. A substrate loading/unloading gate 132 for loading or unloading the wafers 200 with respect to the vacuum transfer chamber 140 is installed at the rear side of the housing 131 of the load lock chamber 130. The substrate loading/unloading gate 132 is opened or closed by a gate valve 134, thereby making it possible to load or unload the wafers 200.

A substrate mounting stand 136 including at least two substrate mounting surfaces 135 for mounting the wafers 200 is installed in the load lock chamber 130. The distance between the substrate mounting surfaces 135 is set in conformity with the distance between end effectors of arms of a robot 170 which will be described later.

(Vacuum Transfer Chamber)

The substrate processing apparatus 100 includes the vacuum transfer chamber (transfer module) 140 as a transfer chamber serving as a transfer space in which the wafers 200 are transferred under a negative pressure. A housing 141 that constitutes the vacuum transfer chamber 140 is formed in a pentagonal shape in a plan view. The load lock chamber 130 and PM1 to PM4, which are modules (hereinafter referred to as "PM") for processing the wafers 200, are connected to the respective sides of the pentagonal housing 141. The vacuum transfer robot 170 as a transfer part for transferring the wafers 200 under a negative pressure is installed in a substantially central region of the vacuum transfer chamber 140 using a flange 144 as a base.

The vacuum transfer robot 170 installed in the vacuum transfer chamber 140 is configured so that it can be moved up and down by an elevator 145 and the flange 144 while maintaining the air-tightness of the vacuum transfer chamber 140. Two arms 180 of the robot 170 are configured so that they can be moved up and down. In FIG. 2, for the sake of convenience in description, the end effectors of the arms 180 are shown and other structures such as first link structures and the like are omitted.

A reactor (hereinafter referred to as "RC") is installed in each of PM1, PM2, PM3 and PM4. Specifically, RC1 and RC2 are installed in PM1. RC3 and RC4 are installed in PM2. RC5 and RC6 are installed in PM3. RC7 and RC8 are installed in PM4.

A partition wall is installed between the two RCs installed in each of the PMs so that the atmospheres of the below-mentioned process spaces 205 are not mixed with each other. Thus, the two RCs installed in each of the PMs are configured so that each of the process spaces 205 has an independent atmosphere.

Substrate loading/unloading gates 148 are installed in the sidewalls of the housing 141, which face the respective RCs. For example, as illustrated in FIG. 2, a substrate loading/unloading gate 148(5) is installed in the sidewall which faces RC5. Moreover, a gate valve 149 is installed in each of the RCs. For example, a gate valve 149(5) is installed in RC5. RC1 to RC4 and RC6 to RC8 have the same configuration as RC5. Thus, the descriptions thereof will be omitted herein.

Figure 4:
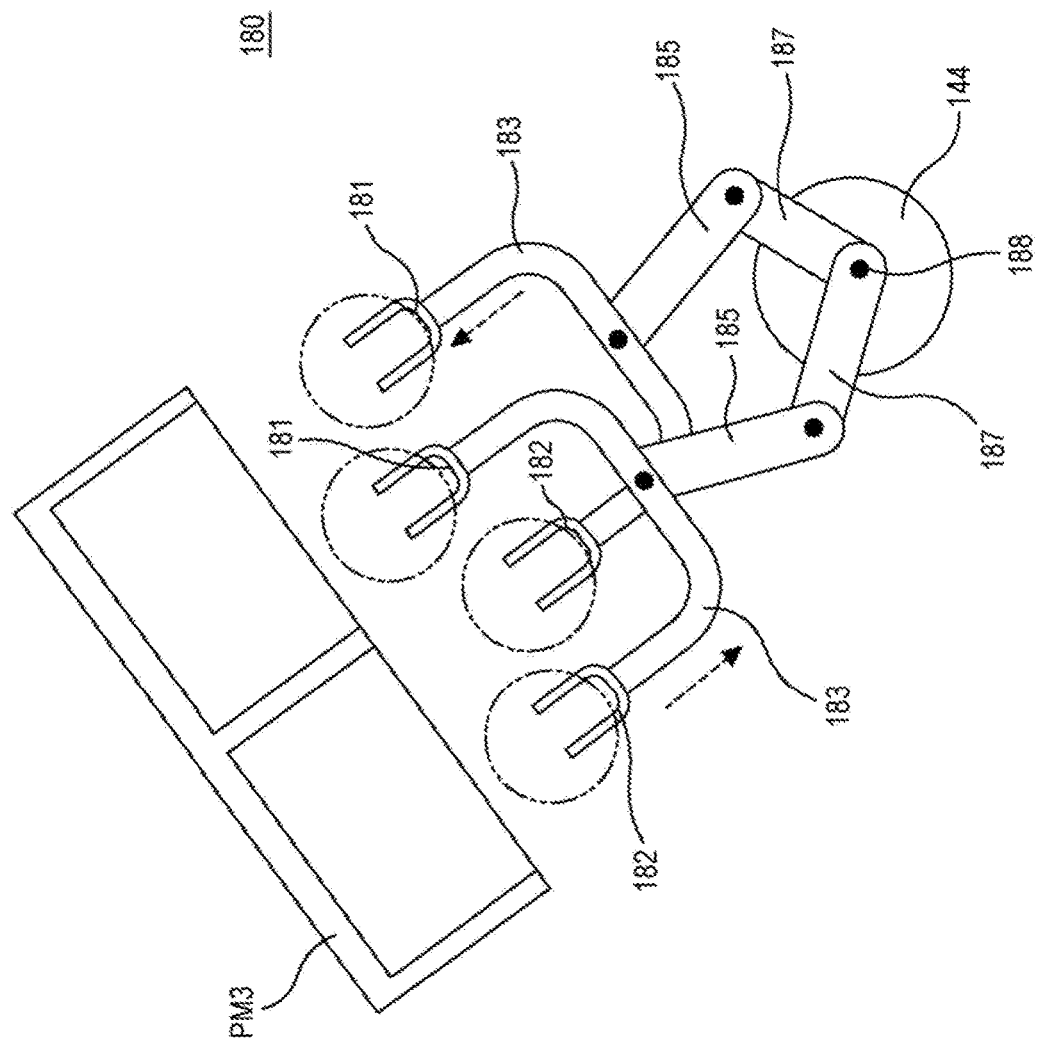
FIG. 4 is an explanatory view illustrating a robot according to an embodiment of the present disclosure.

Subsequently, the robot 170 mounted in the vacuum transfer chamber 140 will be described with reference to FIG. 4. FIG. 4 is an enlarged view of the robot 170 illustrated in FIG. 1.

The robot 170 includes two arms 180.

Each of the arms 180 mainly includes an end effector 181, an end effector 182, a first link structure 183, a second link structure 185, a third link structure 187, and shafts for connecting the first link structure 183, the second link structure 185 and the third link structure 187. The third link structure 187 is rotatably fixed to the flange 144.

Referring back to FIG. 2, an arm control part 171 that controls the up-down movement and rotation of each of the arms 180 is installed in the elevator 145. The arm control part 171 mainly includes a support shaft 171a configured to support a shaft 188, and an actuator part 171b configured to elevate or rotate the support shaft 171a. A hole is formed in the flange 114 between the shaft 188 and the support shaft 171a. The support shaft 171a is configured to directly support the shaft 188. The actuator part 171b includes, for example, an elevator mechanism 171c including a motor for realizing up-down movement and a rotation mechanism 171d such as gears or the like for rotating the support shaft 171a. In the elevator 145, an instruction part 171e for instructing the actuator part 171b to make up-down movement and rotation may be installed as a portion of the arm control part 171. The instruction part 171e is electrically connected to a controller 280. The instruction part 171e controls the actuator part 171b based on the instruction of the controller 280.

Each of the arms 180 is rotatable about the shafts and is extendible. By making rotation and extension, each of the arms 180 loads the wafers 200 into the RCs and unloads the wafers 200 from the interior of the RCs. In addition, each of the arms 180 may transfer the wafer to the RC corresponding to the wafer number in response to the instruction of the controller 280.

(Controller)

The substrate processing apparatus 100 includes the controller 280 configured to control the operations of the respective parts of the substrate processing apparatus 100.

Figure 5:
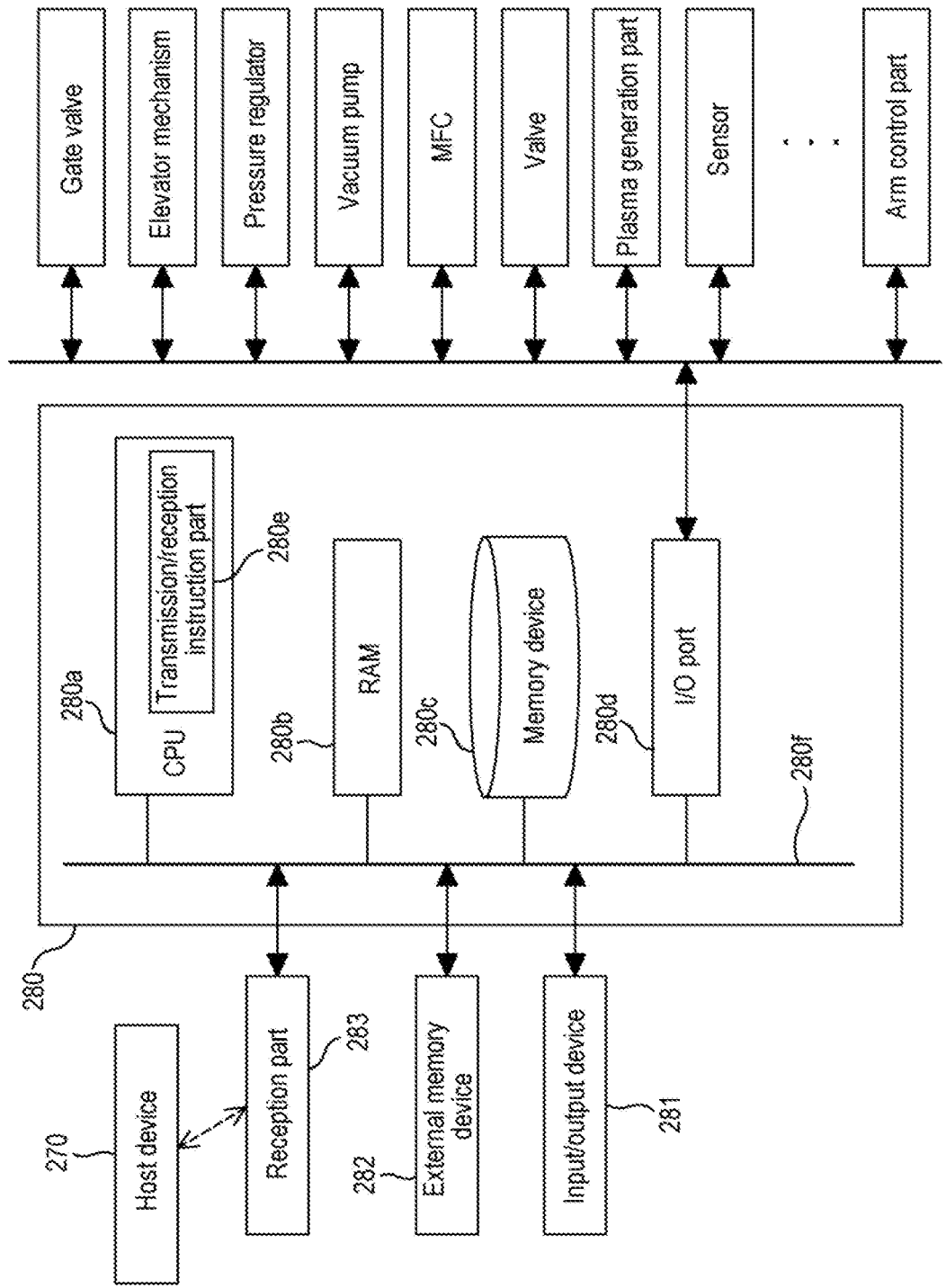
FIG. 5 is an explanatory view illustrating a controller according to an embodiment of the present disclosure.

An outline of the controller 280 is illustrated in FIG. 5. The controller 280, which is a control part (control means), is configured as a computer including a central processing unit (CPU) 280a, a random access memory (RAM) 280b, a memory device 280c as a memory part, and an I/O port 280d. The RAM 280b, the memory device 280c and the I/O port 280d are configured to exchange data with the CPU 280a via an internal bus 280f. Transmission and reception of data in the substrate processing apparatus 100 are performed by the instruction of a transmission/reception instruction part 280e which is one function of the CPU 280a.

An input/output device 281 configured as, for example, a touch panel, and an external memory device 282 are connectable to the controller 280. Moreover, there is installed a reception part 283 connected to a host device 270 via a network. The reception part 283 may receive process information or the like on the wafers 200 stored in the pod 111 from the host device 270. The process information will be described later.

The memory device 280c is formed of, for example, a flash memory, a hard disk drive (HDD) or the like. A control program which controls the operation of the substrate processing apparatus, a process recipe in which substrate processing procedures and conditions to be described later are written, and tables to be described later, are readably stored in the memory device 280c. The process recipe functions as a program for causing the controller 280 to execute each sequence of a below-described substrate processing process to obtain predetermined result. Hereinafter, the process recipe and the control program will be generally and simply referred to as "program." When the term "program" is used herein, it may indicate a case of including a process recipe, a case of including a control program, or a case of including both a process recipe and a control program. The RAM 280b is configured as a memory area (work area) in which a program or data read by the CPU 280a is temporarily stored.

The I/O port 280d is connected to the respective components of the substrate processing apparatus 100, such as the individual gate valves 149, an elevator part 218 installed in a below-described reactor, individual pressure regulators, individual pumps, individual sensors 291 and 292, an arm control part 171 and the like.

The CPU 280a is configured to read and execute the control program from the memory device 280c and is configured to read the process recipe from the memory device 280c in response to the input of an operation command from the input/output device 281. Furthermore, the CPU 280a is configured to control, according to the content of the process recipe thus read, the opening/closing operations of the gate valves 149, the operation of the robot 170, the elevating operation of the elevator part 218, the operations of the sensors 291 and 292, the on/off operations of the respective pumps, the flow rate adjustment operations of the mass flow controllers, the operations of the valves, and the like. In addition, the CPU 280a is configured to count the number of wafer processing times of the respective RCs.

The controller 280 according to the present embodiment may be configured by installing a program in a computer using the external memory device 282 (e.g., a magnetic disc such as a hard disc or the like, an optical disc such as a DVD or the like, a magneto-optical disc such as an MO or the like, or a semiconductor memory such as a USB memory or the like). However, a means for supplying a program to a computer is not limited to a case where the program is supplied through the external memory device 282. For example, the program may be supplied using a communication means such as the Internet or a dedicated line without going through the external memory device 282. The memory device 280c or the external memory device 282 is configured as a non-transitory computer-readable recording medium. Hereinafter, the memory device 280c and the external memory device 282 will be generally and simply referred to as a "recording medium." When the term "recording medium" is used herein, it may indicate a case of including the memory device 280c, a case of including the external memory device 282, or a case of including both the memory device 280c and the external memory device 282.

(2) Configuration of Module

Next, the configurations of PM1 to PM4 and RC1 to RC8 will be described. Since PM1 to PM4 have the same configuration, they will be described as a PM herein. Furthermore, since RC1 to RC8 have the same configuration, they will be described as an RC herein.

(Module)

Figure 6:
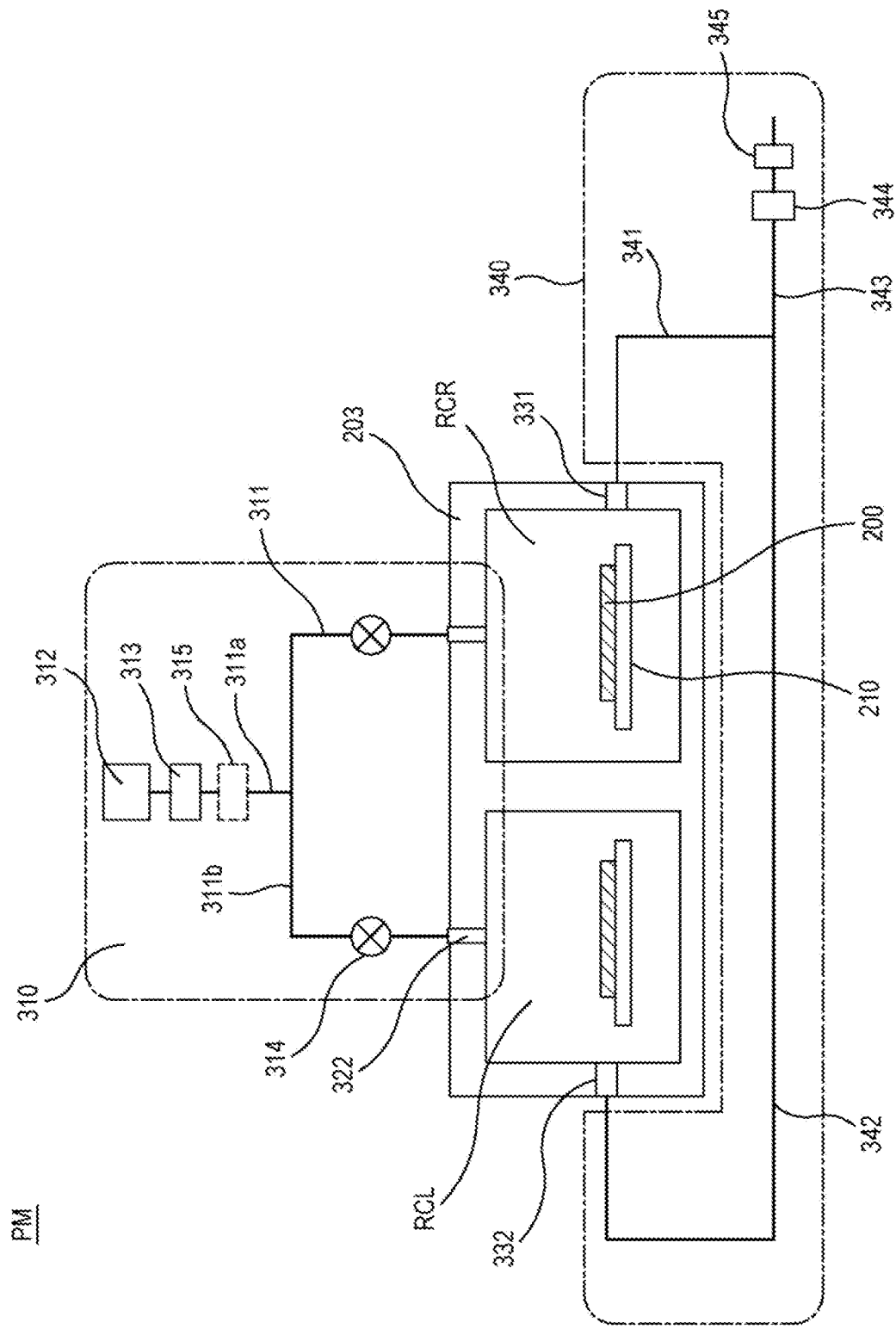
FIG. 6 is an explanatory view illustrating a process module according to an embodiment of the present disclosure.

The PM will be described with reference to FIGS. 1, 2 and 6. FIG. 6 is a sectional view taken along line β-β' in FIG. 1 and is an explanatory view illustrating the relationship between the RCs, the gas supply system and the gas exhaust system, which constitute the PM. In the present embodiment, the RCs, the gas supply system and the gas exhaust system will be collectively referred to as "PM".

The PM includes a housing 203. Two RCs whose atmospheres are isolated are installed in the housing 203. The two RCs will be referred to as "RCR" and "RCL" herein. For example, in PM3, the RCL corresponds to RC6 and the RCR corresponds to RC5.

A substrate support part 210 configured to support a wafer 200 is installed inside each of the RCs.

A gas supply system 310 configured to supply a process gas is installed in the RCR and the RCL. The gas supply system 310 includes a gas supply pipe 311. A gas source 312 is installed at the upstream side of the gas supply pipe 311. The RCR and the RCL are installed at the downstream side of the gas supply pipe 311. The gas supply pipe 311 is distributed to the RCs. In this regard, the gas supply pipe before distribution, namely the gas supply pipe 311 existing at the side of the gas source 312 will be referred to as gas supply pipe 311a. The gas supply pipe after distribution, namely the gas supply pipe 311 existing at the side of the RCs will be referred to as gas supply pipe 311b.

A mass flow controller 313 is installed in the gas supply pipe 311a. The downstream ends of the gas supply pipe 311b are connected to the respective RCs so as to communicate with a gas supply hole 321 formed in the RCR and a gas supply hole 322 formed in the RCL. Valves 314 corresponding to the respective RCs are installed in the gas supply pipe 311b. A remote plasma unit 315 may be installed in the gas supply pipe 311a. The gas supply pipe 311, the mass flow controller 313 and the valves 314 will be collectively referred to as "gas supply system".

Figure 7:
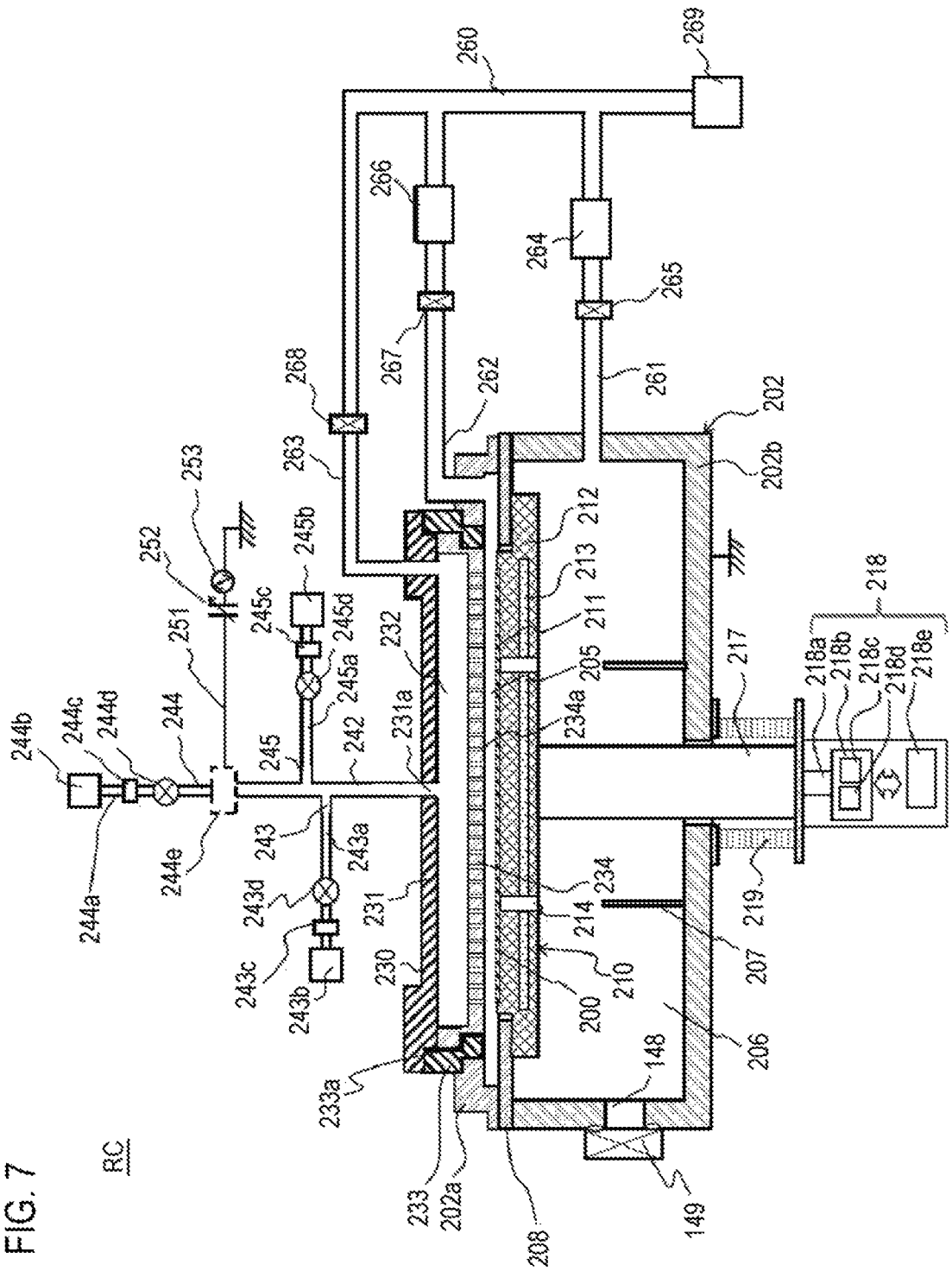
FIG. 7 is an explanatory view illustrating a schematic configuration example of a reactor according to an embodiment of the present disclosure.

In the present embodiment, the mass flow controller 313 and the remote plasma unit 315 are installed in the gas supply pipe 311a. However, the present disclosure is not limited thereto. The mass flow controller 313 and the remote plasma unit 315 may be installed in the gas supply pipe 311b in a corresponding relationship with each of the RCs. As illustrated in FIG. 7, the substrate processing apparatus according to the present embodiment includes at least three gas supply systems. In FIG. 6, for the sake of convenience in description, one gas supply system is illustrated.

In the PM, there is installed a gas exhaust system 340 configured to exhaust a gas from the RCR and the RCL. Exhaust pipes, which constitute the gas exhaust system 340, include an exhaust pipe 341 installed so as to communicate with an exhaust hole 331 of the RCR, an exhaust pipe 342 installed so as to communicate with an exhaust hole 332 of the RCL, and a junction pipe 343 at which the exhaust pipe 341 and the exhaust pipe 342 are merged. A pressure regulator 344 and a pump 345 are installed in the junction pipe 343 sequentially from the upstream side of the junction pipe 343. The pressure regulator 344 and the pump 345 adjust the internal pressure of chambers in cooperation with the gas supply system 310.

In the configuration described above, components common to the RCR and the RCL will be referred to as common components of a module. For example, in the embodiment described above, the mass flow controller 313 and the pressure regulator 344 will be referred to as common components. As long as a component is common to the RCR and the RCL, for example, the remote plasma unit 315 may be regarded as a common component. In addition, the gas source 312 and the pump 345 may be regarded as common components.

FIG. 7 is an explanatory view schematically illustrating one example of a schematic configuration of the RC of the substrate processing apparatus according to a first embodiment.

(Vessel)

As illustrated in FIG. 7, the RC includes a vessel 202. The vessel 202 includes an adjoining RC as illustrated in FIG. 1 or 6. For the sake of convenience in description, the adjoining RC is omitted herein.

The vessel 202 is configured as, for example, a flat sealed vessel having a circular cross section. Furthermore, the vessel 202 is made of a metallic material such as, for example, aluminum (Al) or stainless steel (SUS). In the vessel 202, there are formed the process space 205 in which a wafer 200 such as a silicon wafer or the like is processed and a transfer space 206 through which the wafer 200 passes when the wafer 200 is transferred to the process space 205. The vessel 202 is configured by an upper vessel 202a and a lower vessel 202b. A partition plate 208 is installed between the upper vessel 202a and the lower vessel 202b.

The substrate loading/unloading gate 148 adjoining the gate valve 149 is formed on a side surface of the lower vessel 202b. The wafer 200 is moved between the transfer space 206 and the transfer chamber 140 through the substrate loading/unloading gate 148. A plurality of lift pins 207 is installed in the bottom portion of the lower vessel 202b. In addition, the lower vessel 202b is grounded.

The substrate support part 210 configured to support the wafer 200 is disposed in the process space 205. The substrate support part 210 mainly includes a substrate mounting surface 211 configured to mount the wafer 200, a substrate mounting table 212 provided with the substrate mounting surface 211 on the front surface thereof, and a heater 213 as a heat source installed in the substrate mounting table 212. Through-holes 214, through which the lift pins 207 can penetrate, are formed in the substrate mounting table 212 in the positions corresponding to the lift pins 207.

The substrate mounting table 212 is supported by a shaft 217. The shaft 217 extends through the bottom portion of the vessel 202. The shaft 217 is connected to the elevator part 218 on an outer portion.

The elevator part 218 mainly includes a support shaft 218a configured to support the shaft 217 and an actuator part 218b configured to vertically move or rotate the support shaft 218a. The actuator part 218b includes, for example, an elevator mechanism 218c including a motor for realizing vertical movement, and a rotation mechanism 218d such as gears or the like for rotating the support shaft 218a.

In the elevator part 218, an instruction part 218e for instructing the actuator part 218b to perform vertical movement or rotational movement may be installed as a part of the elevator part 218. The instruction part 218e is electrically connected to the controller 280. The instruction part 218e controls the actuator part 218b in response to an instruction of the controller 280.

If the shaft 217 and the substrate mounting table 212 are vertically moved by actuating the elevator part 218, it is possible for the substrate mounting table 212 to vertically move the wafer 200 mounted on the substrate mounting surface 211. The periphery of the lower end portion of the shaft 217 is covered with a bellows 219, whereby the process space 205 is kept airtight.

When transferring the wafer 200, the substrate mounting table 212 is moved down to a position where the substrate mounting surface 211 faces the substrate loading/unloading gate 148. When processing the wafer 200, the substrate mounting table 212 is moved up until the wafer 200 reaches a process position in the process space 205 as illustrated in FIG. 7.

A shower head 230 as a gas dispersion mechanism is installed in an upper region (at the upstream side) of the process space 205. A through-hole 231a is formed in a lid 231 of the shower head 230. The through-hole 231a is in communication with a gas supply pipe 242 which will be described later.

The shower head 230 includes a dispersion plate 234 as a dispersion mechanism for dispersing a gas. A buffer space 232 is defined at the upstream side of the dispersion plate 234. The process space 205 is defined at the downstream side of the dispersion plate 234. A plurality of through-holes 234a is formed in the dispersion plate 234. The dispersion plate 234 is disposed so as to face the substrate mounting surface 211. The dispersion plate 234 is formed in, for example, a disc shape. The through-holes 234a are formed over the entire surface of the dispersion plate 234.

The upper vessel 202a includes a flange. A support block 233 is placed on and fixed to the flange. The support block 233 includes a flange 233a. The dispersion plate 234 is placed on and fixed to the flange 233a. The lid 231 is fixed to the upper surface of the support block 233.

(Supply Part)

The supply part of the vessel 202 described herein has the same configuration as the gas supply system 310 illustrated in FIG. 6. The configuration of the supply part corresponding to one chamber will now be described in detail.

The common gas supply pipe 242 is connected to the lid 231 so as to communicate with the gas introduction hole (through-hole) 231a (corresponding to the gas supply hole 321 or 322 of FIG. 6) formed in the lid 231 of the shower head 230. The common gas supply pipe 242 corresponds to the gas supply pipe 311 illustrated in FIG. 6.

A first gas supply pipe 243a, a second gas supply pipe 244a and a third gas supply pipe 245a are connected to the common gas supply pipe 242.

(First Gas Supply System)

A first gas source 243b, a mass flow controller (MFC) 243c, which is a flow rate controller (flow rate control part), and a valve 243d, which is an opening/closing valve, are installed in the first gas supply pipe 243a sequentially from the upstream side.

The first gas source 243b is a source of a first gas containing a first element (hereinafter referred to as "first-element-containing gas"). The first-element-containing gas is a precursor gas, namely one of the process gases. In this regard, the first element is, for example, silicon (Si). That is to say, the first-element-containing gas is, for example, a silicon-containing gas. Specifically, a hexachlorodisilane ($Si_2Cl_6$, which is also referred to as "HCD") gas is used as the silicon-containing gas.

A first gas supply system 243 (also referred to as "silicon-containing gas supply system") is mainly configured by the first gas supply pipe 243a, the mass flow controller 243c and the valve 243d.

(Second Gas Supply System)

A second gas source 244b, a mass flow controller (MFC) 244c, which is a flow rate controller (flow rate control part), and a valve 244d, which is an opening/closing valve, are installed in the second gas supply pipe 244a sequentially from the upstream side.

The second gas source 244b is a source of a second gas containing a second element (hereinafter referred to as "second-element-containing gas"). The second-element-containing gas is one of the process gases. The second-element-containing gas may be considered as a reaction gas or a modification gas.

In this regard, the second-element-containing gas contains a second element differing from the first element. The second element is, for example, one of oxygen (O), nitrogen (N) and carbon (C). In the present embodiment, it is assumed that the second-element-containing gas is, for example, an oxygen-containing gas. Specifically, an oxygen ($O_2$) gas is used as the oxygen-containing gas.

When the wafer 200 is processed by a second gas having a plasma state, a remote plasma unit 244e may be installed in the second gas supply pipe 244a. The remote plasma unit 244e corresponds in configuration to the remote plasma unit 315 illustrated in FIG. 6.

A wiring line 251 is connected to the remote plasma unit 244e. A power source 253 is installed at the upstream side of the wiring line 251. A frequency matcher 252 is installed between the remote plasma unit 244e and the power source 253. Electric power is supplied from the power source 253. A matching-purpose parameter is adjusted by the frequency matcher 252. Plasma is generated by the remote plasma unit 244e. In the present embodiment, the remote plasma unit 244e, the wiring line 251 and the frequency matcher 252 will be collectively referred to as a "plasma generation pan". The power source 253 may be added to the plasma generation part.

A second gas supply system 244 (also referred to as "oxygen-containing gas supply system") is mainly configured by the second gas supply pipe 244a, the mass flow controller 244c and the valve 244d.

(Third Gas Supply System)

A third gas source 245b, a mass flow controller (MFC) 245c, which is a flow rate controller (flow rate control part), and a valve 245d, which is an opening/closing valve, are installed in the third gas supply pipe 245a sequentially from the upstream side.

The third gas source 245b is a source of an inert gas. The inert gas is, for example, a nitrogen ($N_2$) gas.

A third gas supply system 245 is mainly configured by the third gas supply pipe 245a, the mass flow controller 245c and the valve 245d.

In a substrate processing process, the inert gas supplied from the inert gas source 245b acts as a purge gas that purges a gas staying in the vessel 202 or the shower head 230.

(Exhaust System)

The exhaust system corresponds in configuration to the gas exhaust system 340 illustrated in FIG. 6. The exhaust system, which exhausts the atmosphere of the vessel 202, includes a plurality of exhaust pipes connected to the vessel 202. Specifically, the exhaust system includes an exhaust pipe (first exhaust pipe) 263 connected to the buffer space 232, an exhaust pipe (second exhaust pipe) 262 connected to the process space 205 and an exhaust pipe (third exhaust pipe) 261 connected to the transfer space 206. In addition, an exhaust pipe (fourth exhaust pipe) 260 is connected to the downstream side of the respective exhaust pipes 261, 262 and 263.

The exhaust pipe 261 is installed at the lateral side or the lower side of the transfer space 206. A pump 264 (TMP: Turbo Molecular Pump) is installed in the exhaust pipe 261. A valve 265 as a first exhaust valve for the transfer space is installed in the exhaust pipe 261 at the upstream side of the pump 264.

The exhaust pipe 262 is installed at the lateral side of the process space 205. An auto pressure controller (APC) 266, which is a pressure controller for controlling the internal pressure of the process space 205 at a predetermined pressure, is installed in the exhaust pipe 262. The APC 266 includes a valve body (not shown) whose opening degree is adjustable. The APC 266 adjusts the conductance of the exhaust pipe 262 in response to an instruction received from the controller 280. A valve 267 is installed in the exhaust pipe 262 at the upstream side of the APC 266. The exhaust pipe 262, the valve 267 and the APC 266 will be collectively referred to as a "process chamber exhaust system".

The exhaust pipe 263 is connected to a surface differing from the surface of the process space 205. A valve 268 is installed in the exhaust pipe 263. The exhaust pipe 263 and the valve 268 will be collectively referred to as a "shower head exhaust system".

A dry pump (DP) 269 is installed in the exhaust pipe 260. As illustrated in FIG. 7, the exhaust pipe 263, the exhaust pipe 262 and the exhaust pipe 261 are connected to the exhaust pipe 260 sequentially from the upstream side thereof. The DP 269 is installed at the downstream side of the exhaust pipe 260. The DP 269 exhausts the respective atmospheres of the buffer space 232, the process space 205 and the transfer space 206 through the exhaust pipe 262, the exhaust pipe 263 and the exhaust pipe 261, respectively. When the TMP 264 is in operation, the DP 269 serves as an auxiliary pump of the TMP 264. That is to say, since it is difficult to perform the exhaust to atmospheric pressure using the TMP 264, which is a high vacuum (or ultrahigh vacuum) pump, only, the DP 269 is used as an auxiliary pump for performing the exhaust to atmospheric pressure. For example, air valves are used as the respective valves of the exhaust system described above.

(Sensor)

Sensors as detection parts for detecting quality information are installed in each of the PMs. Specifically, as illustrated in FIG. 8, the common sensor 291 for detecting quality information of common components and the RC sensors 292 for detecting quality information of individual components of the RCs are installed in each of the PMs.

Figure 8:
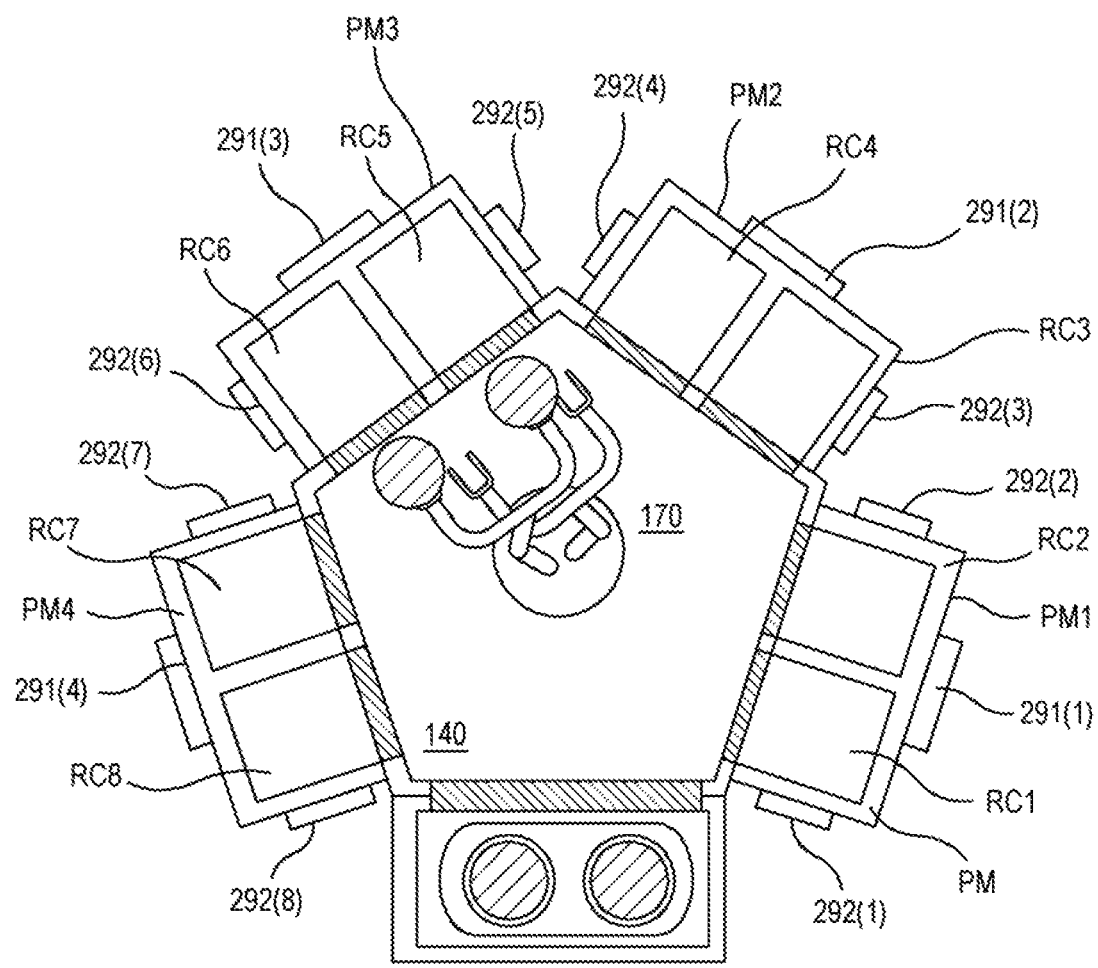
FIG. 8 is an explanatory view illustrating a substrate processing apparatus according to an embodiment of the present disclosure.

Referring to FIG. 8, a common component sensor 291(1), an RC sensor 292(1) for detecting quality information of RC1 and an RC sensor 292(2) for detecting quality information of RC2 are installed in PM1. Similarly, a common component sensor 291(2), an RC sensor 292(3) for detecting quality information of RC3 and an RC sensor 292(4) for detecting quality information of RC4 are installed in PM2. Similarly, a common component sensor 291(3), an RC sensor 292(5) for detecting quality information of RC5 and an RC sensor 292(6) for detecting quality information of RC6 are installed in PM3. Similarly, a common component sensor 291(4), an RC sensor 292(7) for detecting quality information of RC7 and an RC sensor 292(8) for detecting quality information of RC8 are installed in PM4. The respective sensors are electrically connected to the controller 280. The controller 280 is configured to receive the information detected by the respective sensors.

(Table)

Figure 11B:
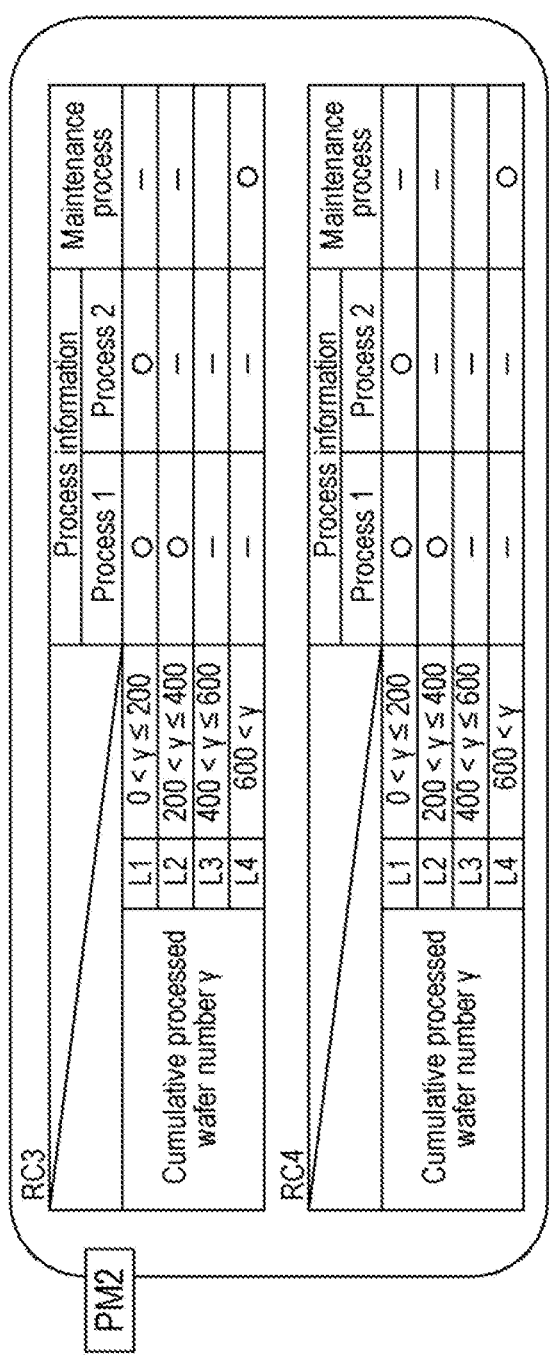
Figure 11C:
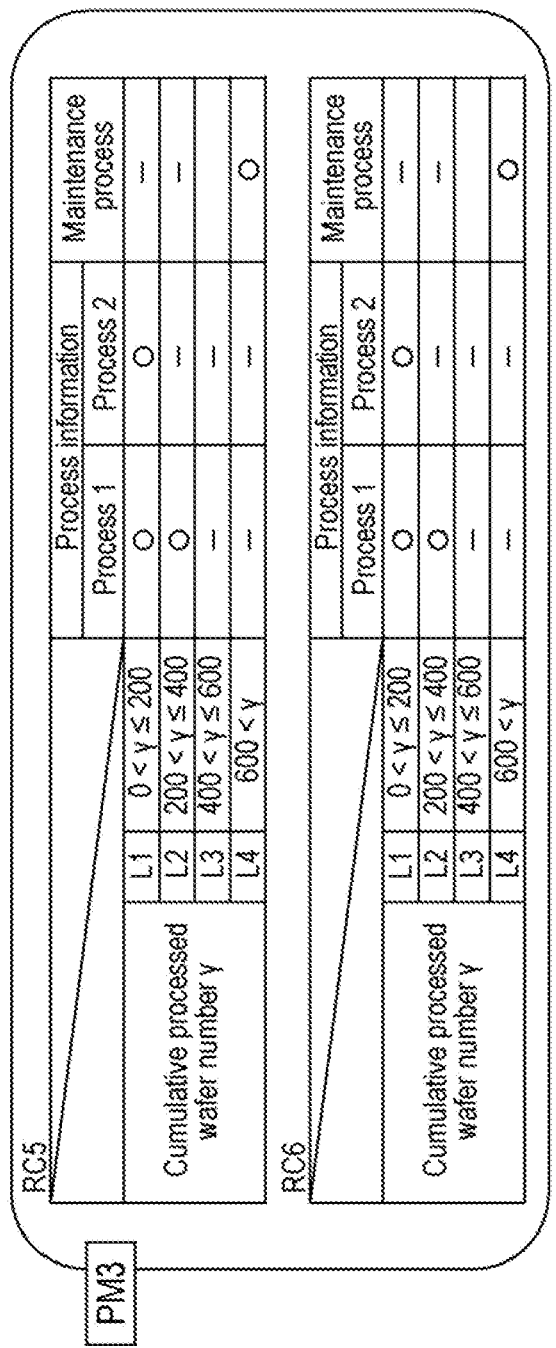
Figure 11D:
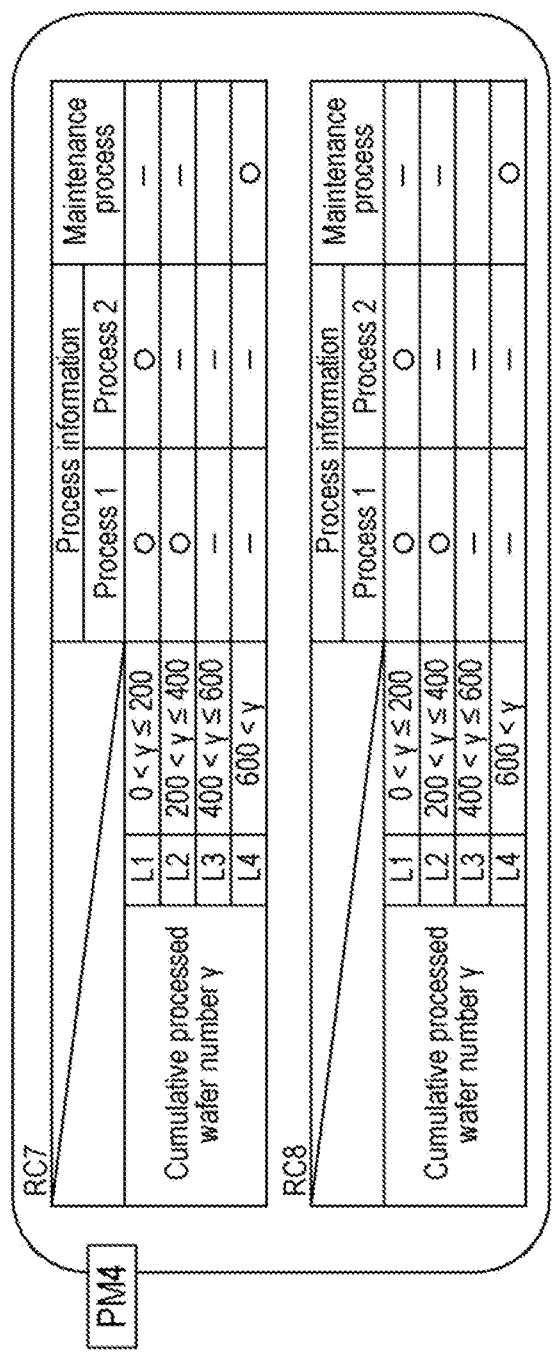

Next, tables stored in the memory device 280c will be described with reference to FIGS. 9, 10 and 11.

The table illustrated in FIG. 9 is a table showing the relationship between the respective PMs and the quality information. Module quality information and wafer quality information exist as the quality information. The module quality information is quality information on the PMs. The module quality information includes reactor quality information (hereinafter referred to as "RC quality information"), which is quality information of the RCs, and common component quality information on the common components, which are components common to two RCs. Symbols A1, . . . , and K8 denote areas where the latest quality information data are stored.

The RC quality information is quality information on the respective RCs. For example, the RC quality information may include the "cumulative processed wafer number" which is the cumulative number of wafers 200 processed, the "plasma control system" which indicates the cumulative operation time of the component (e.g., the frequency matcher 252) constituting the plasma generation part, and the "gas supply/exhaust system" which indicates the operation time of the component (e.g., the valve) constituting the gas supply system and the gas exhaust system or the information on the pressure or the opening degree as a result of the operation. The RC quality information is detected in real time by the sensors 292(1) to 292(8). The detection values detected by the respective sensors are stored in A1, . . . , and D8 of the data table. For example, if the quality information of the plasma control system is detected by the sensor 292(1), the controller 280 receives the quality information and writes quality information data into B1 of the data table.

The common component quality information is the information on the common components of the respective RCs of the PMs. The "common component quality information" is the information on the operation time of the common components, for example, the components (e.g., the mass flow controller and the pump) constituting the gas supply system and the exhaust system, or the information on the pressure or the opening degree as a result of the operation. The common component quality information is detected by the sensors 291(1) to 291(4). The detection values detected by the respective sensors are stored in E1, . . . , and F4 of the data table. For example, if the quality information data of the common gas supply/exhaust systems are detected by the sensor 291(1), the controller 280 receives the quality information data and writes the quality information data into E1 of the data table.

In the present embodiment, there is described an example in which the quality information is detected by the sensors 292. However, the present disclosure is not limited thereto. For example, the information of the control system such as the cumulative processed wafer number or the like may be directly counted by the controller 280. In this case, the controller 280 may be called a detection part.

Next, the wafer quality information will be described. The wafer quality information indicates the quality of the processed wafer. For example, the wafer quality information may include the "particle number" per unit area, the "wafer in-plane distribution" which indicates a process distribution of the wafer, the "refractive index" of a film formed on the wafer 200, and the "film stress" of a film formed on the wafer 200. The process distribution of the wafer may be, for example, a film thickness distribution or a film density and may be an impurity concentration distribution. The detection data thus detected are stored in G1, . . . , and K8 of the data table.

In the case where the wafer quality information cannot be detected by the substrate processing apparatus 100 according to the present embodiment, the quality information of the wafer 200 previously processed in the same chamber may be detected by another detection device. The information thus detected may be received by the reception part 283 through the host device 270. For example, as for the information on the particle number of the wafer processed in RC1, the quality information on the particle number of the wafer previously processed in RC1 is received from the host device 270. The quality information data thus received are written into G1 of the data table.

Subsequently, descriptions will be made on definition table 1 shown in FIG. 10. Definition table 1 compares the process information of the wafer 200 with the quality information.

First, descriptions will be made on the process information. The process information indicates a process of the wafer 200 processed in the substrate processing apparatus 100. For example, the process information may include an oxide film formation process in a double patterning process, a formation process of an interlayer insulation film formed of an oxide film, a formation process of an inter-wiring-line insulation film formed of an oxide film, and the like. All the processes mentioned above are processes in which silicon oxide film (SiO film) is formed using the same kind of gas.

While a silicon oxide film is formed in each of the processes, it is known that different film qualities are required. For example, in a double patterning process, it is required that a silicon oxide film has a small number of particles. This is because the impurity existing in the silicon oxide film adversely affects etching, as a result of which a fine pattern cannot be formed. Accordingly, it is desirable that the wafer 200 be processed in a rector having a small number of particles.

In an interlayer insulation film formation process, it is necessary to remove particles to some extent. On the other hand, a double patterning process is not affected by an impurity. This is because an interlayer insulation film is polished after forming the interlayer insulation film, which hardly affects other films. Accordingly, it is desirable that the wafer 200 be processed in a reactor having a relatively small number of particles, although the level of particles is not the same as that of the aforementioned double patterning process.

In an inter-wiring-line insulation film formation process, when a film is formed on the wafer 200, it is required that the film formed on the wafer 200 be modified by a predetermined amount of plasma. Specific reasons are as follows. As generally known, the distance between wiring lines grows shorter along with the recent miniaturization of a wiring pattern. An inter-wiring-line insulation film is formed between the wiring lines. If a large amount of impurity is contained in the inter-wiring-line insulation film, a resistance value may be changed. Thus, there is a possibility that the film quality cannot be made uniform within a wafer plane. In the case of forming the inter-wiring-line insulation film, for example, the film is formed by a first gas containing an impurity. Subsequently, the film is modified by a second gas for removing the impurity. Accordingly, in a modification process, it is desirable that the wafer 200 be processed in the RC in which plasma is generated at such a level as to uniformly desorb the impurity. In addition, it is conceivable that the interior of the vessel is etched due to abnormal electric discharge caused by the plasma generation part and further that the particles thus generated are infiltrated into the film. In this case, there is a possibility that the adjoining wiring lines are conducted with each other. For that reason, it is required that plasma be stably generated.

As described above, the environment required in the reactor varies depending on the process. Thus, in definition table 1, the quality information corresponds to the process information. For example, when the wafer 200 is processed in the reactor having a small amount of particles, the "cumulative processed wafer number" is selected as the quality information. This is because, if the cumulative processed wafer number in one chamber is large, the gas adheres to the inner wall of the apparatus and the like and is peeled off to become particles. Furthermore, when the wafer 200 is processed in the reactor in which a predetermined amount of plasma is generated, the "plasma control system" is selected as the quality information. This is because, if the plasma control system is degraded, it is not possible to generate a desired amount of plasma.

In this way, the process information of the wafer 200 received from the host device is compared in definition table 1 to determine which of the quality information is preferentially used to process the wafer 200. This process is performed on the wafers 200 stored in the pod 111.

The aforementioned selection method will be described in more detail. For example, if the wafer 200 of W(j) is process 1 (P1 in FIG. 10) (hereinafter referred to as "P1"), it is determined that the wafer 200 is processed based on the information "cumulative processed wafer number". Similarly, if the wafer 200 of W(j) is process 2 (P2 in FIG. 10) (hereinafter referred to as "P2"), it is determined that the wafer 200 is processed based on the information "cumulative processed wafer number". If the wafer 200 of W(j) is process 7 (P7 in FIG. 10) (hereinafter referred to as "P7"), it is determined that the wafer 200 is processed based on the information "common gas supply/exhaust system". If the wafer 200 of W(j) is process 0 (hereinafter referred to as "P0"), it is determined that the wafer 200 is processed not based on the quality information.

Subsequently, descriptions will be made on definition table 2 shown in FIGS. 11A to 11D. Definition table 2 is a table which compares the latest data of the quality information with table groups set on a PM-by-PM basis. In this example, the latest data (data A1, . . . , and K8 in FIG. 9) stored in the data table are compared with the process information.

In definition table 2, the quality information is divided into a plurality of levels and the relationship between the process information and the quality information is recorded on a RC-by-RC basis. The definition table 2 shown in FIGS. 11A to 11D is an example in which the cumulative processed wafer number is used as the quality information. If the cumulative processed wafer number is assumed to be $\gamma$, "$0<\gamma\leq200$ in level 1 (L1)", "$200<\gamma\leq400$ in level 2 (L2)", "$400<\gamma\leq600$ in level 3 (L3)", and "$600<\gamma$ in level 4 (L4)". Symbol "O" indicates that the wafer 200 can be processed in the RC. Symbol "-" indicates that the wafer 200 cannot be processed in the RC.

For example, in the case of RC1, O is affixed to L1 and L2 in P1. This indicates that the wafer 200 can be processed if the cumulative processed wafer number falls within a range of "$0<\gamma\leq400$". O is affixed to L1 in P2. This indicates that the wafer 200 can be processed if the cumulative processed wafer number falls within a range of "$0<\gamma\leq200$". The wafer number is set to a cumulative number at which the respective processes are not affected by particles. For example, if P1 is an interlayer insulation film formation process, a cumulative processed wafer number which does not affect the interlayer insulation film formation process is extracted by prior experiments. Moreover, for example, if P2 is an oxide film formation process of a double patterning process, a cumulative processed wafer number which does not affect the oxide film formation process is extracted by prior experiments. As described above, the oxide film formation process of the double patterning process is more susceptible to particles than the interlayer insulation film formation process. Thus, the cumulative number of the process is set smaller than the cumulative number of P1.

If the cumulative processed wafer number falls within a range of "$400<\gamma\leq600$", P1 and P2 becomes infeasible. In addition, if the cumulative processed wafer number is "$600<\gamma$", a maintenance process is selected.

In FIGS. 11A to 11D, there is illustrated an example in which the quality information is the "cumulative processed wafer number". As for other quality information, tables corresponding to the content of FIGS. 11A to 11D exist. Descriptions on other quality information tables will be omitted.

For example, if the wafer 200 of W(j) is P1, the "cumulative processed wafer number" is selected from definition table 1 and the latest wafer processing number of each of the RCs is compared in definition table 2. P1 is feasible if the cumulative processed wafer number n of the RC falls within a range of "$0<\gamma\leq400$". In addition, if the wafer 200 of W(j) is P2, the "cumulative processed wafer number" is selected from definition table 1 and the latest wafer processing number of each of the RCs is compared in definition table 2. P2 is feasible if the cumulative processed wafer number n of the RC falls within a range of "$0<\gamma\leq200$".

(4) Substrate Processing Process

Next, as one type of semiconductor manufacturing process, a process of forming a thin film on the wafer 200 using the RC configured as above will be described. In the following descriptions, the operations of the respective parts constituting the substrate processing apparatus are controlled by the controller 280.

Descriptions will be made on an example in which an HCD gas obtained by vaporizing HCD is used as a first-element-containing gas (first process gas), an $O_2$ gas is used as a second-element-containing gas (second process gas), and a silicon oxide (SiO) film as a silicon-containing film is formed on the wafer 200 by alternately supplying the HCD gas and the $O_2$ gas.

Figure 12:
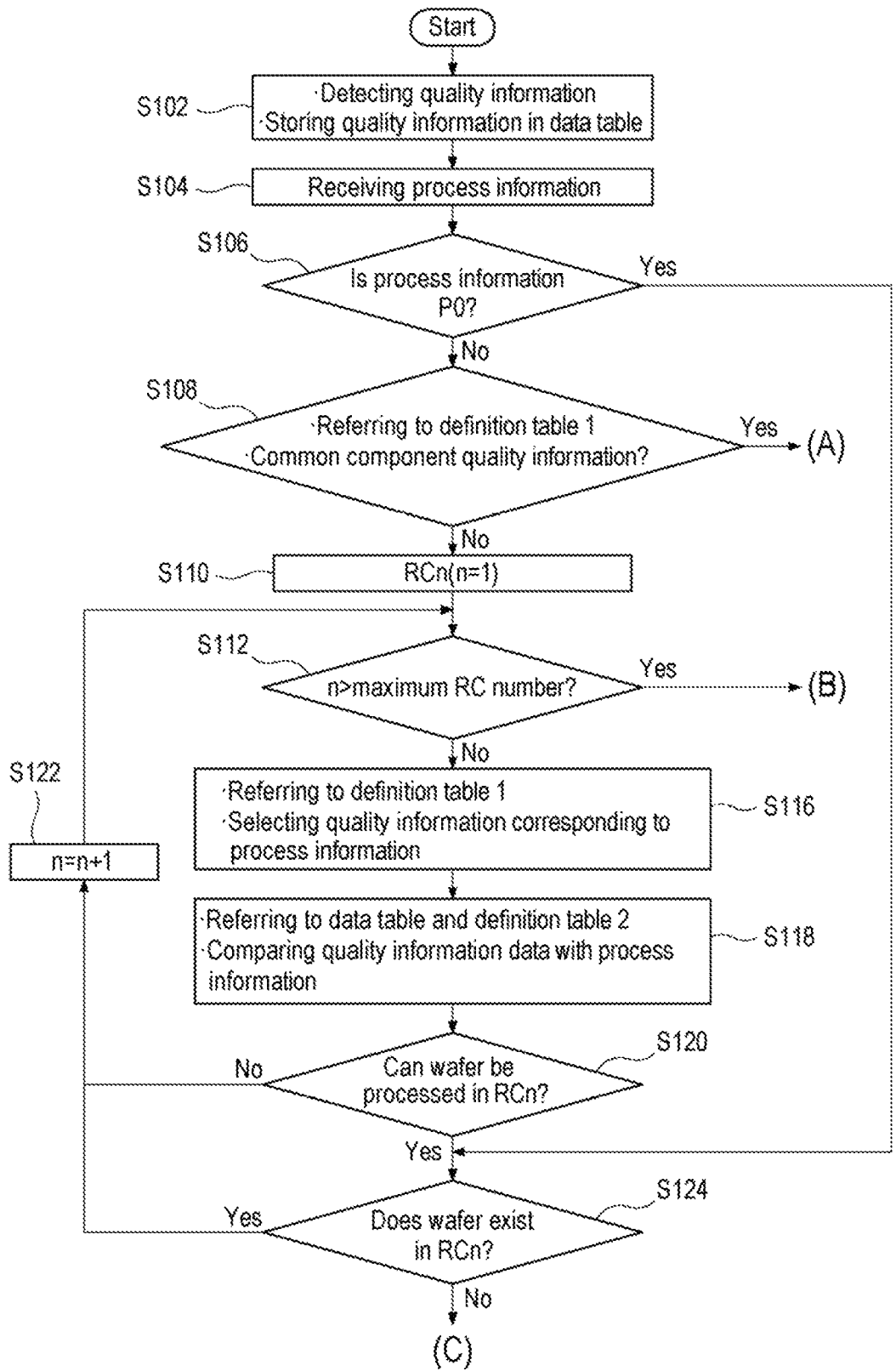
FIG. 12 is a flowchart illustrating a substrate processing flow according to an embodiment of the present disclosure.

FIG. 12 is a flowchart illustrating an outline of a substrate processing process according to the present embodiment. Symbols (A) to (D) are configurations leading to FIGS. 13 and 14.

First, the flow will be described with reference to FIGS. 12, 13 and 14.

(S102)

This step is a step at which the quality information of each of the PMs is detected and is stored in the data table. For example, the quality information data of the common components of each of the PMs are detected by the sensor 291. The quality information data of each of the RCs are detected by the sensor 292. Thereafter, the latest quality information data are stored in the data table in real time. For example, in the case of the cumulative processed wafer number of RC1, cumulative processing number data are stored in A1. In the case of the information on the plasma control system of RC1, the data of the plasma control system, for example, the cumulative use time of the remote plasma unit 244e, are stored in B1.

If the quality information is the wafer quality information, the quality information data of the wafer are received from the host device. The quality information data of the wafer are the information linked to each of the RCs. The quality information is stored in the data table. For example, if the data of the wafer 200 previously processed in RC1 are particle data, the data are stored in G1. If the data of the wafer 200 processed in RC3 are wafer in-plane distribution data, the data are stored in H3.

(S104)

This step is a step at which the process information of the wafer is received from the host device. The term "process information" used herein refers to an oxide film formation process of a double patterning process, an interlayer insulation film formation process, or the like. In the present embodiment, for example, the information which indicates that "the wafers 200 of from W(1) to W(j) are P1 and the wafers 200 of from W(j+1) to W(k) are P2", is received. Furthermore, in the present embodiment, it is assumed that P1 is an interlayer insulation film formation process and P2 is an oxide film formation process of a double patterning process.

(S106)

It is determined whether the process information of the wafer 200 is P0. If the process information is P0, namely if "Yes" at S106, the flow proceeds to step S124, which will be described later, thereby determining the RC. If the process information is not P0, namely if "No" at S106, the flow proceeds to step S108.

(S108)

At this step, by referring to definition table 1, it is determined whether the quality information corresponding to the process information is the common component quality information. If the quality information is the common component quality information, "Yes" is selected so that the flow proceeds to (A). Symbol (A) leads to the flow illustrated in FIG. 14. If the quality information is not the common component quality information, namely if the quality information is the RC quality information or the wafer quality information, "No" is selected so that the flow proceeds to S110.

(S110)

After it is determined that the wafer 200 is processed on the basis of the RC quality information or the wafer quality information, an initial value of RCn for processing the wafer 200 is set. In this example, n is set to n=1.

(S112)

At S112, it is determined whether n is a numerical value larger than the maximum RC number. In the present embodiment, the RCs are from RC1 to RC8. Thus, the maximum number is 8. Accordingly, it is determined whether "n>8". If n>8, "Yes" is selected so that the flow proceeds to (B). If n≤8, "No" is selected so that the flow proceeds to S116.

(S114)

Figure 13:
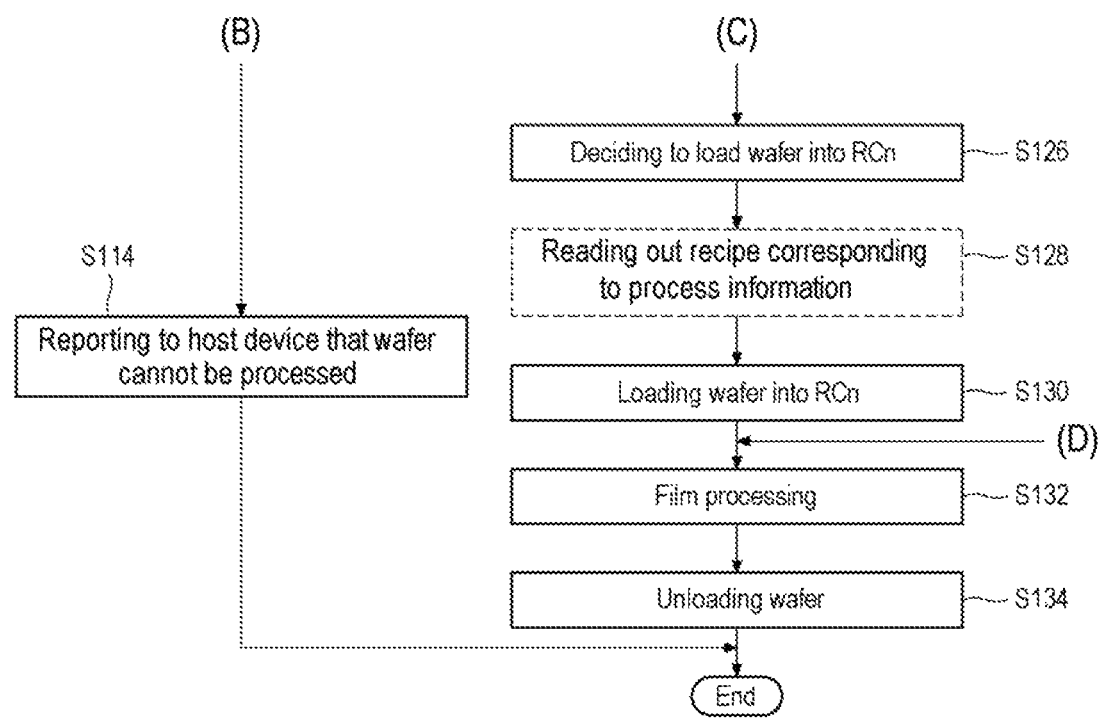
FIG. 13 is a flowchart illustrating a substrate processing flow according to an embodiment of the present disclosure.
Figure 14:
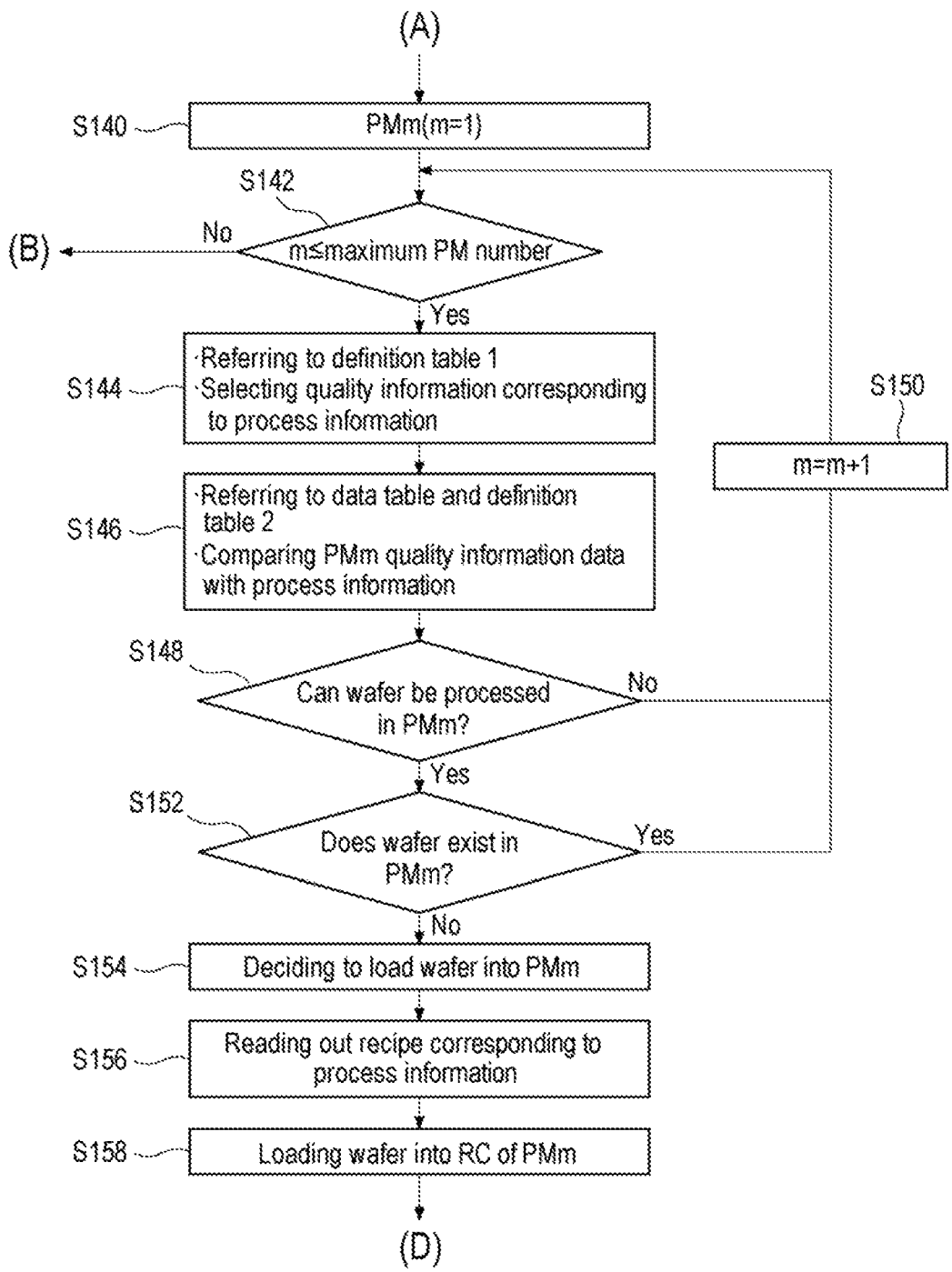
FIG. 14 is a flowchart illustrating a substrate processing flow according to an embodiment of the present disclosure.

Symbol (B) is connected to S114 of FIG. 13. If it is determined at S112 that n>maximum RC number, it means that an RC capable of processing the wafer 200 does not exist. Under this circumstance, at S114, the situation that "an RC capable of processing the wafer 200 does not exist" is reported to the host device. Thereafter, the flow comes to an end and waits for an instruction from the host device.

(S116)

By referring to definition table 1, the quality information corresponding to the process information of the wafer is confirmed and selected. For example, if the wafers 200 from W(1) to W(j) are P1, it is confirmed that the quality information is the cumulative processed wafer number. Then, the quality information is selected. Furthermore, if the wafers 200 of from W(j+1) to W(k) are P2, it is similarly confirmed that the quality information is the cumulative processed wafer number. Then, the quality information is selected.

(S118 to S126)

At S118, by referring to data table and definition table 2, the latest quality information stored in RCn of the data table is compared with the process information of the wafer. For example, when the wafer of P1 is processed in RC1, by referring to definition table 2, it is determined whether the latest quality information data A1 falls within a range of the "cumulative processed wafer number" which is the quality information of P1.

If the result of determination reveals that the latest quality information data A1 does not fall within a range of the quality information, it is determined at S120 that the wafer 200 cannot be processed. "No" is selected so that the flow proceeds to S122. If the result of determination reveals that the latest quality information data A1 falls within a range of the quality information, it is determined that the wafer 200 can be processed. The flow proceeds to S124.

At S122, n is updated to n=n+1 and the flow proceeds to the next RCn+1. RC1 proceeds to RC2. If the wafer 200 can be processed, the flow proceeds to (C). Symbol (C) is connected to S126 of FIG. 13. At S124, it is determined whether the wafer 200 exists in RCn. If the wafer 200 exists in RCn, "Yes" is selected so that the flow proceeds to S122 to determine whether the wafer 200 can be processed in the next RC. If the wafer 200 does not exist in RCn, "No" is selected so that the flow proceeds to S126. At S126, it is decided to load the wafer 200 into RCn.

The flow from S118 to S126 will be described by taking, as an example, a case where the wafer 200 of W(j) is P1.

First, at S116, by referring to definition table 1, the "cumulative processed wafer number", which is the quality information corresponding to P1, is selected.

Next, at S118, by referring to definition table 2, the relationship between P1 and the quality information is read out. In the case of P1, it can be noted that the quality information is "the cumulative processed wafer number n $0<\gamma\leq400$" and the wafer 200 can be processed. Then, data A1 are read out from the data table. It is determined whether the data A1 falls within a range of the quality information. In this example, it is determined whether the cumulative processed wafer number of RC1 falls within a range of the cumulative number of P1. If the result of determination reveals that the data A1 does not fall within a range of the quality information, namely if the result of determination reveals that the cumulative processed wafer number γ is larger than 400, it is determined at S120 that the wafer 200 cannot be processed. "No" is selected so that the flow proceeds to S122. If the result of determination reveals that the data A1 falls within a range of the quality information, namely if the result of determination reveals that the cumulative processed wafer number n is $0<\gamma\leq400$, it is determined at S120 that the wafer 200 can be processed. Thus, the flow proceeds to S124.

If the quality information data written in the data table fall within a range of a maintenance process, the maintenance process may be performed without loading the wafer into the RC. For example, if the cumulative processed wafer number γ is larger than 600, the maintenance process is performed.

At S124, it is determined whether the wafer exists in RC1. If the wafer exists, the flow proceeds to S122. If the wafer does not exist, the flow proceeds to S126.

If it is determined that the wafer 200 cannot be processed in RC1, n is updated to n=n+1 at S122. Thus, RC2 is selected. Thereafter, similar to RC1, it is determined whether the wafer 200 can be processed in RC2.

If it is determined that the wafer 200 can be processed in RC1, it is decided at S126 to load the wafer into RC1.

If W(j+1) is P2, the quality information on P2 of definition table 2 is read out. In this example, it can be noted that the cumulative processed wafer number γ is $0<\gamma\leq200$. Accordingly, in the case of P2, the RC is selected according to the relevant condition.

As described above, by selecting the reactor based on the quality information of the process information, it is possible to perform wafer processing under the condition suitable for each of the processes.
(S128)

This step is performed when a process recipe differs in the respective process information. For example, process 3 (indicated by P3 in FIG. 10) is a process recipe that performs a CVD process in which two kinds of gases are simultaneously supplied, and process 4 (indicated by P4 in FIG. 10) is a process recipe that performs a cyclic process in which gases are alternately supplied. Since the gas supply/exhaust control or the pressure control differs in the CVD process and the cyclic process, a process recipe corresponding to each of the CVD process and the cyclic process is read out.

In this way, by making it possible to select the reactor based on the quality information of each of the processes and making it possible to select the process recipe corresponding to each of the processes, it is possible to reduce the total number of process recipes stored in the memory device 280c. In the case where the same process recipe is used in the respective processes, this step may be omitted.

In the case where, as in the related art, the reactor cannot be selected based on the quality information of the process information, a process recipe corresponding to each of the film types is needed in each of the processes. For example, when a process recipe for forming a silicon oxide film in a cyclic process is used as a basic process recipe, there are needed a process recipe modified in such a direction as to suppress generation of particles and a process recipe modified so as to control a supply amount of plasma. It is also conceivable to prepare in advance a process recipe for transferring a wafer to a specific RC based on the quality information. Even in this method, process recipes corresponding to the process information are needed.

As described above, in the case of the related art, process recipes are needed just as much as the process information. In contrast, in the present embodiment, it is just as necessary to prepare a basic process recipe. Thus, as compared with the related art, it is possible to reduce the total number of process recipes.
(S130)

After RCn into which the wafer 200 is loaded is decided at S126, the wafer 200 is loaded into RCn.
(S132)

At S132, the wafer 200 loaded into RCn is subjected to film processing. The term "film processing" includes, for example, a film forming process, a film modification process and an etching process. A flow of the film processing will be described later.
(S140)

Next, a case where "Yes" is selected at S108 and the flow proceeds to (A) will be described with reference to FIG. 14. The case where "Yes" is selected at S108 indicates that the quality information is the common component quality information. An initial value of PMm for processing the wafer 200 is set. In this example, it m is set to m=1.
(S142)

At S142, it is determined whether m is equal to or smaller than the maximum PM number. In the present embodiment, the PMs are from PM1 to PM4. Thus, the maximum PM number is four. Accordingly, it is determined whether "m≤4". If m≤4, "Yes" is selected so that the flow proceeds to S144. If m>4, the flow proceeds to S114 shown in FIG. 13.
(S144)

By referring to definition table 1, the quality information corresponding to the process information of the wafer is confirmed and selected. For example, the common gas supply/exhaust information is selected.
(S146 to S154)

At step S146, by referring to data table and definition table 2, the latest quality information data stored in PMm of the data table is compared with the process information of the wafer. For example, when the wafer of process 7 (P7 in FIG. 10) (hereinafter referred to as P7) is processed in PM1, by referring to definition table 2, it is determined whether the latest quality information data E1 falls within a range of the "common gas supply/exhaust system" which is the quality information of P7.

If the result of determination reveals that the latest quality information data do not fall within the quality information, it is determined at S148 that the wafer 200 cannot be processed. "No" is selected so that the flow proceeds to S150. If the result of determination reveals that the latest quality information data fall within the quality information, it is determined at S148 that the wafer 200 can be processed. The flow proceeds to S152.

At S150, m is updated to m=m+1 and the flow proceeds to the next PMm+1. PM1 proceeds to PM2. If the wafer 200 can be processed, the flow proceeds to S152 where it is determined whether the wafers 200 exist in the two RCs of the PMm. If the wafers 200 exist, "Yes" is selected so that the flow proceeds to S150 to determine whether the wafers 200 can be processed in the next PM. If the wafers 200 do not exist, "No" is selected so that the flow proceeds to S154. At S154, it is decided to load the wafers 200 into the PMm.

The flow from S144 to S154 will be described by taking, as an example, a case where the wafer 200 of W(j) is P7.

First, at S144, by referring to definition table 1, the "common gas supply/exhaust system", which is the quality information corresponding to P7, is selected.

Next, at step S146, by referring to definition table 2, the relationship between P7 and the quality information is read out. In the case of P7, the quality information is the "common gas supply/exhaust system", for example, the cumulative operation time of the pressure regulator 344. Data E1 are read out from the data table. It is determined whether the data E1 fall within a range of the quality information. In this example, it is determined whether the cumulative operation time of the pressure regulator 344 falls within a range of the quality information. If the result of determination reveals that the cumulative operation time of the pressure regulator 344 does not fall within a range of the quality information, namely if it is determined that the cumulative operation time is longer than a predetermined time, it is determined at S146 that the wafer 200 cannot be processed. "No" is selected so that the flow proceeds to S150. If the result of determination reveals that the cumulative operation time of the pressure regulator 344 falls within a range of the quality information, namely if it is determined that the cumulative operation time is shorter than the predetermined time, it is determined at S146 that the wafer 200 can be processed. The flow proceeds to S152.

At S152, it is determined whether the wafer exists in at least one of the two RCs of PMm. If the wafer exists, the flow proceeds to S150. If the wafer does not exist in any of the two RCs of PMm, the flow proceeds to S154.

If it is determined that the wafer 200 cannot be processed in PM1, m is updated to m=m+1 at S150. Thus, PM2 is selected. Thereafter, similar to PM1, it is determined whether the wafer 200 can be processed in PM2.

If it is determined that the wafer 200 can be processed in PM1, it is decided at S154 to load the wafer into PM1.

As described above, by selecting the PM based on the quality information of the respective process information, it is possible to perform wafer processing under the condition suitable for each of the processes.

(S156)

This step is performed not only in the case where the process recipe differs in the respective process information but also in the case where the wafer is processed only in one of the RCs of the PM. For example, when the wafers are loaded into and processed in the RCL and RCR which are the two RCs illustrated in FIG. 6, a process recipe which makes sure that the RCR and the RCL are under the same condition is read out. Furthermore, when the wafer is loaded into and processed in the RCL but the wafer is not loaded into the RCR, a process recipe which makes sure that a process gas is supplied to the RCL but is not supplied to the RCR is read out. The reason for not supplying the process gas to the RCR is that, if the process gas is supplied in a state in which the wafer does not exist, the process gas adheres to the substrate mounting surface 211, causing generation of particles.

As described above, by making it possible to select the PM based on the process information of the respective processes, it is possible to select the process recipe corresponding to the respective process information. Thus, it is possible to reduce the total number of process recipes stored in the memory device 280c.

In the apparatus having a configuration in which one module includes a plurality of RCs as in the present embodiment, even when the number of wafers to be processed does not match with the number of RCs, the selection of an optimal process recipe makes it possible to prevent degradation of the quality of the RC into which the wafer is not loaded.

(S158)

After PMm, into which the wafer is loaded, is decided at S154, the wafers 200 are loaded into the RCs of PMm. At this time, if the loading destination RCs are decided by the process recipe read out at S156, the wafers 200 are loaded into the RCs thus decided. When deciding the loading destination RCs, the loading destination RCs may be decided according to the quality information as is the case at S116 to S118.

After the loading destination RCs are decided, the flow proceeds to (D). (D) is connected to the upstream side of S132 illustrated in FIG. 13.

(S134)

After the film processing is completed in the respective RCs, the wafers 200 are unloaded.

Figure 15:
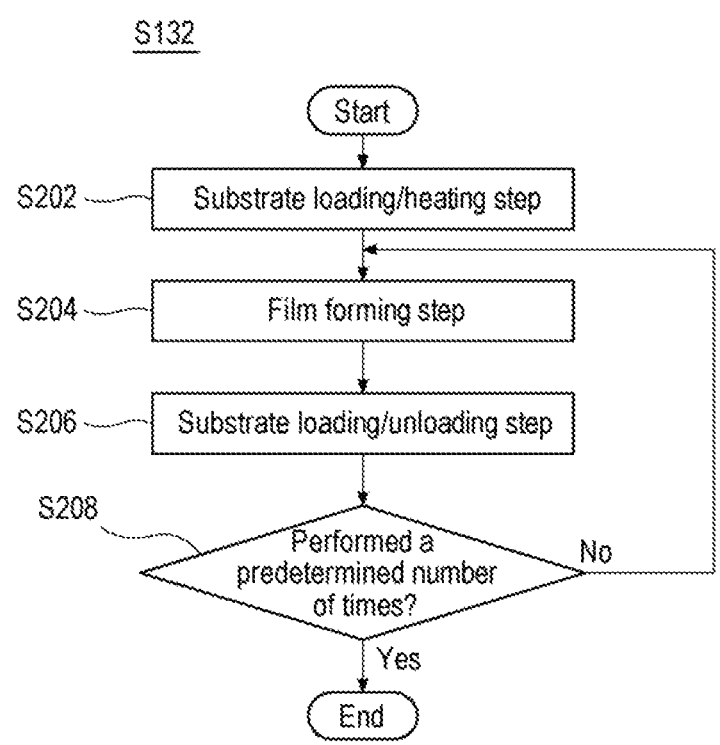
FIG. 15 is a flowchart illustrating a substrate processing flow according to an embodiment of the present disclosure.

Next, the details of the film processing flow of S132 will be described with reference to FIG. 15.

(S202)

After the wafer 200 is loaded into the vessel 202, the vacuum transfer robot 170 is retracted to the outside of the vessel 202 and the gate valve 149 is closed to seal the interior of the vessel 202. Thereafter, by moving the substrate mounting table 212 upward, the wafer 200 is mounted on the substrate mounting surface 211 of the substrate mounting table 212. By further moving the substrate mounting table 212 upward, the wafer 200 is moved up to the process position (substrate processing position) in the aforementioned process space 205.

After the wafer 200 is loaded into the transfer space 206 and is then moved up to the process position in the process space 205, the valve 265 is closed. Thus, the path between the transfer space 206 and the TMP 264 and the path between the TMP 264 and the exhaust pipe 260 are cut off, whereby the exhaust of the transfer space 206 performed by the TMP 264 comes to an end. On the other hand, the valve 267 is opened, thereby bringing the process space 205 and the APC 266 into communication with each other and bringing the APC 266 and the DP 269 into communication with each other. The APC 266 adjusts the conductance of the exhaust pipe 262, thereby controlling the exhaust flow rate of the process space 205 exhausted by the DP 269 and maintaining the process space 205 at a predetermined pressure (e.g., at a high vacuum of $10^{-5}$ to $10^{-1}$ Pa).

In this way, at S202, the internal pressure of the process space 205 is controlled to become a predetermined pressure and the surface temperature of the wafer 200 is controlled to become a predetermined temperature. The predetermined temperature is, for example, room temperature or more and 500 degrees C. or less, specifically room temperature or more and 400 degrees C. or less. The predetermined pressure may be set at, for example, 50 to 5,000 Pa.

(S204)

After S202, a film forming process of S204 is performed. In the film forming process, according to the process recipe, the first gas supply system is controlled to supply the first gas into the process space 205 and the exhaust system is controlled to exhaust the process space 205, thereby performing film processing. In this case, the second gas supply system may be controlled to perform a CVD process in which the second gas and the first gas are allowed to coexist in the process space 205 or a cyclic process in which the first gas and the second gas are alternately supplied. In the case where the process is performed by keeping the second gas in a plasma state, the remote plasma unit 244e may be operated.

The cyclic process, which is a specific example of the film processing method, may be performed in the following manner. For example, an HCD gas is used as the first gas and an $O_2$ gas is used as the second gas. In this case, at a first step, the HCD gas is supplied into the process space 205. At a second step, the $O_2$ gas is supplied into the process space 205. At a purge step, an $N_2$ gas is supplied between the first step and the second step while exhausting the atmosphere of the process space 205. An SiO film is formed by performing a cyclic process which performs, multiple times, a combination of the first step, the purge step and the second step. (S206)

At S206, the processed wafer 200 is unloaded from the vessel 202 in an order that is opposite to the order of S202 described above.

(S208)

In the same procedure as that of S202, an unprocessed wafer 200 on standby is loaded into the vessel 202. Thereafter, S204 is performed with respect to the wafer 200 thus loaded.

(Effect)

While one embodiment of the present disclosure has been described above, some representative effects achieved by the present disclosure will be enumerated below.

(a) Films, which have the same type but differ in film quality, can be processed in a single processing apparatus.

(b) The RC (or the PM) is selected according to the process information of the wafer and the quality information of the RC (or the PM). Thus, even if the requirement for film quality varies depending on the process, it is possible to reliably clear the required quality.

(c) The rector can be selected based on the quality information of each of the processes and the process recipe corresponding to each of the processes can be selected. It is therefore possible to reduce the total number of process recipes stored in the memory device.

Other Embodiments

While one embodiment of the present disclosure has been specifically described above, the present disclosure is not limited thereto but may be differently modified without departing from the spirit thereof.

For example, in the embodiment described above, descriptions have been made by taking, as an example, a case where each of the modules PM1 to PM4 includes two process chambers RCL and RCR disposed adjacent to each other. However, the present disclosure is not limited thereto. That is to say, each of the modules PM1 to PM4 may include three or more process chambers.

Furthermore, in the embodiment described above, by way of example of the film forming process using the substrate processing apparatus, there has been illustrated a case where the HCD gas is used as the first-element-containing gas (first process gas), the $O_2$ gas is used as the second-element-containing gas (second process gas), and the HCD gas and the $O_2$ gas are alternately supplied to form the SiO film on the wafer 200. However, the present disclosure is not limited thereto. In other words, the process gases used in the film forming process are not limited to the HCD gas and the $O_2$ gas. Other types of thin films may be formed using other kinds of gases. Moreover, the present disclosure may be applied to a case where three or more kinds of process gases are used, as long as the film forming process is performed by alternately supplying the process gases. Specifically, the first element may not be Si but may be, for example, a variety of elements such as titanium (Ti), zirconium (Zr), hafnium (Hf) and the like. In addition, the second element may not be O but may be, for example, nitrogen (N) or the like.

Furthermore, in the embodiment described above, there has been illustrated, by way of example, a case where the process performed by the substrate processing apparatus is the film forming process. However, the present disclosure is not limited thereto. In other words, the present disclosure may be applied to film forming processes other than the film forming process illustrated in the aforementioned respective embodiments. The specific content of the film forming process does not matter. The present disclosure may be applied not only to the film forming process but also to other substrate processing processes such as an annealing process, a diffusion process, an oxidation process, a nitriding process, a lithography process and the like. Furthermore, the present disclosure may be applied to other substrate processing apparatuses such as, for example, an annealing apparatus, an etching apparatus, an oxidation apparatus, a nitriding apparatus, an exposure apparatus, a coating apparatus, a drying apparatus, a heating apparatus, a plasma-used processing apparatus and the like. Furthermore, these apparatuses may be used in combination. Moreover, some components of one embodiment may be replaced by components of another embodiment. Components of one embodiment may be added to components of another embodiment. In addition, other components may be added to the embodiment and some of the components of the embodiment may be deleted or replaced by other components.

According to the present disclosure in some embodiments, it is possible to provide a technique capable of processing substrates without being restricted to the types of processes.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   a plurality of modules configured to process a substrate;
   a transfer chamber adjoining the modules;
   a transfer part configured to transfer the substrate to one of the modules;
   a reception part configured to receive process information of the substrate;
   a plurality of sensors, which is attached to the modules, configured to detect quality information of the respective modules, the quality information including quality information of components of the respective modules;
   a table in which a plurality of predetermined process information items are in a direct relationship with a plurality of predetermined quality information items;
   a memory part configured to store the table; and
   prior to processing the substrate, a controller configured to select, from the plurality of the predetermined quality information items in the table, a quality information item based on the received process information, configured to compare the selected quality information item with the detected quality information, configured to select one of the modules corresponding to the received process information based on a result of the comparison, and configured to instruct the transfer part to transfer the substrate to the selected module prior to processing the substrate.

2. The apparatus of claim 1, wherein each of the modules includes a plurality of reactors, and the predetermined quality information items include common component quality information items, which are quality information items for common components of the reactors, and reactor quality information items, which are quality information items for components of each of the reactors.

3. The apparatus of claim 2, wherein the memory part is configured to further store a plurality of process recipes, and the controller is configured to select one of the process recipes according to the selected quality information item.

4. The apparatus of claim 2, wherein the predetermined quality information items have a plurality of levels, and the controller is configured to, when selecting one of the modules, determine whether the selected quality information item meets a level required in the received process information.

5. The apparatus of claim 2, wherein the plurality of sensors is configured to detect, as the quality information, an operation time of a component constituting each of the modules or a cumulative processed wafer number in each of the modules.

6. The apparatus of claim 2, wherein each of the modules includes a gas supply system configured to supply a gas to the reactors and an exhaust system configured to exhaust the gas from the reactors, and the plurality of sensors is configured to, when detecting an operation time of each of the modules, detect an operation time of the gas supply system or the exhaust system.

7. The apparatus of claim 1, wherein the memory part is configured to further store a plurality of process recipes, and the controller is configured to select one of the process recipes according to the selected quality information item.

8. The apparatus of claim 7, wherein the predetermined quality information items have a plurality of levels, and the controller is configured to, when selecting one of the modules, determine whether the selected quality information item meets a level required in the received process information.

9. The apparatus of claim 7, wherein the plurality of sensors is configured to detect, as the quality information, an operation time of a component constituting each of the modules or a cumulative processed wafer number in each of the modules.

10. The apparatus of claim 1, wherein the predetermined quality information items have a plurality of levels, and the controller is configured to, when selecting one of the modules, determine whether the selected quality information item meets a level required in the received process information.

11. The apparatus of claim 10, wherein the plurality of sensors is configured to detect, as the quality information, an operation time of a component constituting each of the modules or a cumulative processed wafer number in each of the modules.

12. The apparatus of claim 1, wherein the plurality of sensors is configured to detect, as the quality information, an operation time of a component constituting each of the modules or a cumulative processed wafer number in each of the modules.

13. The apparatus of claim 1, wherein each of the modules includes a plurality of reactors configured to process the substrate, a gas supply system configured to supply a gas to the reactors and an exhaust system configured to exhaust the gas from the reactors, and the plurality of sensors is configured to, when detecting an operation time of each of the modules, detect an operation time of the gas supply system or the exhaust system.

14. The apparatus of claim 2, wherein the common components includes a component shared by the plurality of reactors.

15. The apparatus of claim 3, wherein the controller is configured to, if the substrate is loaded into and processed in each of the plurality of reactors, select one of the process recipes to set the plurality of reactors to be under a same condition.

16. The apparatus of claim 3, wherein the controller is configured to, if the substrate is loaded into at least one first reactor of the plurality of reactors and is not loaded into at least one second reactor of the plurality of reactors, select different process recipes, from the stored process recipes, for the at least one first reactor and the at least one second reactor.

* * * * *